(12) United States Patent
Jaeger et al.

(10) Patent No.: US 9,671,556 B2
(45) Date of Patent: Jun. 6, 2017

(54) OPTOELECTRONIC COMPONENT DEVICE, METHOD FOR PRODUCING AN OPTOELECTRONIC COMPONENT DEVICE AND METHOD FOR OPERATING AN OPTOELECTRONIC COMPONENT DEVICE

(71) Applicant: OSRAM OLED GmbH, Regensburg (DE)

(72) Inventors: Arndt Jaeger, Regensburg (DE); Michael Popp, Freising (DE)

(73) Assignee: OSRAM OLED GMBH, Regenburg (DE)

( * ) Notice: Subject to any disclaimer, the term of this patent is extended or adjusted under 35 U.S.C. 154(b) by 0 days.

(21) Appl. No.: 14/906,943

(22) PCT Filed: Jun. 26, 2014

(86) PCT No.: PCT/EP2014/063550
§ 371 (c)(1),
(2) Date: Jan. 22, 2016

(87) PCT Pub. No.: WO2015/010848
PCT Pub. Date: Jan. 29, 2015

(65) Prior Publication Data
US 2016/0154178 A1    Jun. 2, 2016

(30) Foreign Application Priority Data

Jul. 23, 2013    (DE) .................. 10 2013 107 855

(51) Int. Cl.
*G02B 6/13* (2006.01)
*G02B 6/42* (2006.01)
(Continued)

(52) U.S. Cl.
CPC .......... *G02B 6/12004* (2013.01); *G02B 6/13* (2013.01); *G02B 6/4274* (2013.01);
(Continued)

(58) Field of Classification Search
CPC .... G02B 6/12004; G02B 6/13; G02B 6/4274; H01L 27/288; H01L 51/5262;
(Continued)

(56) References Cited

U.S. PATENT DOCUMENTS

| 7,385,572 B2 | 6/2008 | Yu et al. |
| 2005/0151059 A1* | 7/2005 | Nakajima .......... G06K 15/1214 250/208.1 |

(Continued)

FOREIGN PATENT DOCUMENTS

| CN | 1641720 A | 7/2005 |
| CN | 1682265 A | 10/2005 |

(Continued)

OTHER PUBLICATIONS

International Search Report based on application No. PCT/EP2014/063550 (4 pages and 3 Pages of English translation) dated Sep. 26, 2014.

(Continued)

*Primary Examiner* — John M Bedtelyon
(74) *Attorney, Agent, or Firm* — Viering, Jentschura & Partner mbB

(57) ABSTRACT

Various embodiments may relate to an optoelectronic component device, including a first optically active structure, which is configured to provide an electromagnetic radiation, a measuring structure, which is configured to determine the luminance distribution of the electromagnetic radiation, wherein the measuring structure is configured to determine the luminance distribution in the first optically active structure, and wherein the measurement structure has a plurality of second optically active structures, wherein the plurality of second optically active structures are configured as optoelectric components and/or optoelectronic components, which receive the provided electromagnetic radiation.

11 Claims, 10 Drawing Sheets

(51) Int. Cl.
*H01L 51/52* (2006.01)
*H01L 51/56* (2006.01)
*H01L 27/28* (2006.01)
*G02B 6/12* (2006.01)

(52) U.S. Cl.
CPC ........ *H01L 27/288* (2013.01); *H01L 51/5262* (2013.01); *H01L 51/5275* (2013.01); *H01L 51/56* (2013.01); *H01L 2251/5361* (2013.01); *H01L 2251/568* (2013.01)

(58) Field of Classification Search
CPC ................ H01L 51/5275; H01L 51/56; H01L 2251/5361; H01L 2251/568
See application file for complete search history.

(56) References Cited

U.S. PATENT DOCUMENTS

| | | |
|---|---|---|
| 2009/0231313 A1 | 9/2009 | Teranishi et al. |
| 2010/0295064 A1 | 11/2010 | Loebl et al. |
| 2011/0036992 A1 | 2/2011 | Fukumoto et al. |
| 2011/0284721 A1 | 11/2011 | Iwabuchi et al. |

FOREIGN PATENT DOCUMENTS

| | | |
|---|---|---|
| CN | 101995398 A | 3/2011 |
| DE | 102011084590 A1 | 4/2013 |
| JP | 2005070065 A | 3/2005 |
| JP | 4976605 B1 | 7/2012 |
| WO | 2004023443 A2 | 3/2004 |
| WO | 2007057822 A1 | 5/2007 |
| WO | 2014-067872 A1 | 5/2014 |

OTHER PUBLICATIONS

German Search Report based on application No. DE10 2013 107 855.9(5 pages) dated on Mar. 17, 2014.

Office Action received for the corresponding Chinese application No. 201480042122.5 (11 pages) dated on Jan. 20, 2017 and English translation (5 pages).

* cited by examiner

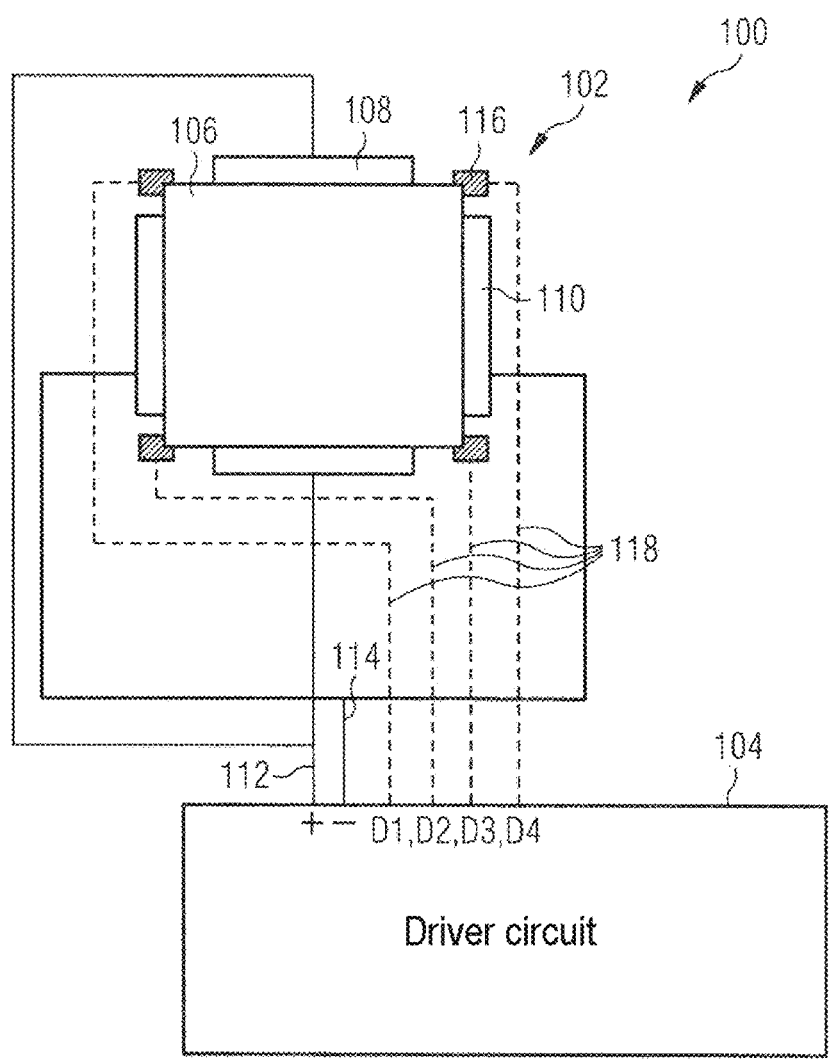

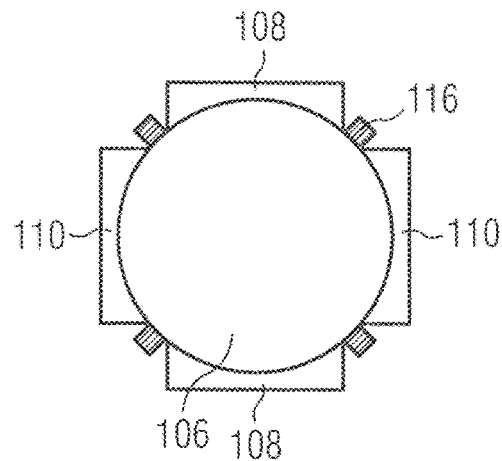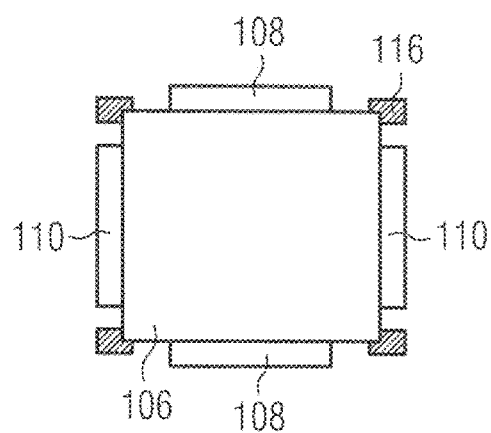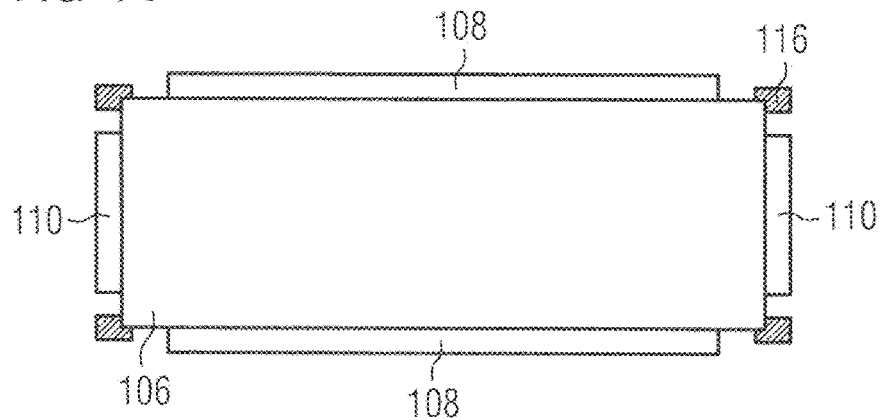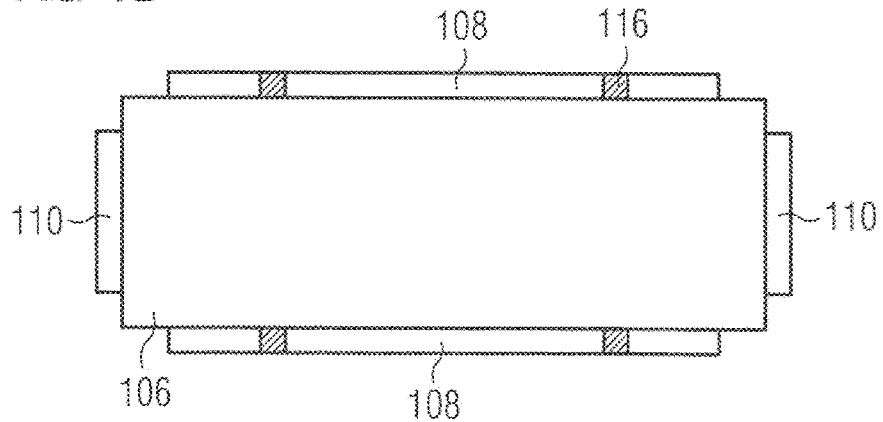

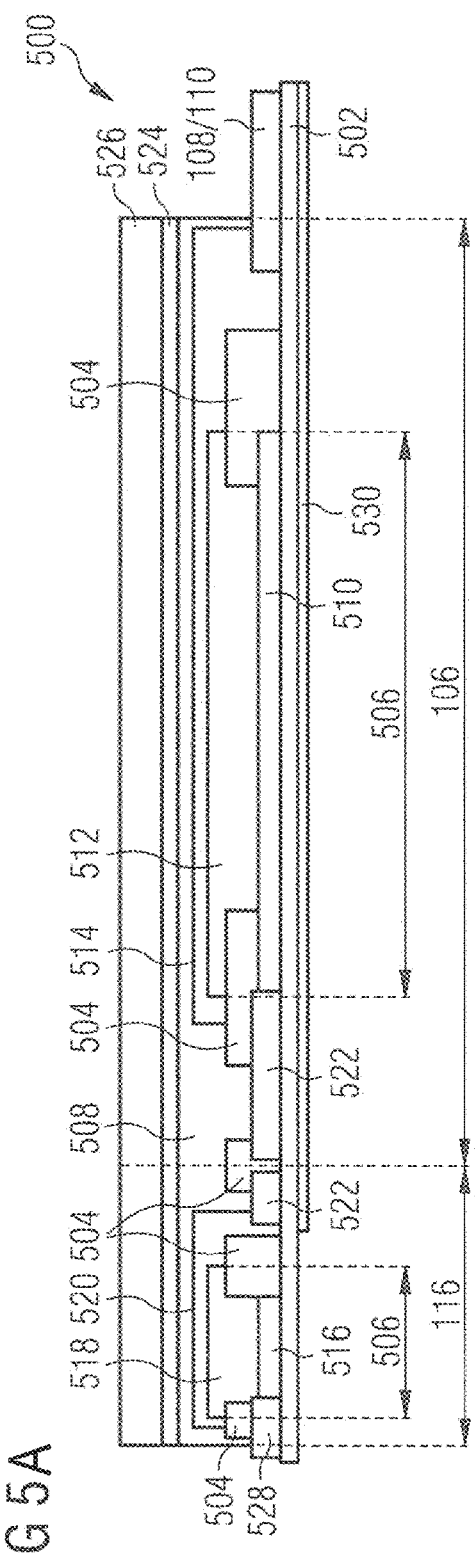
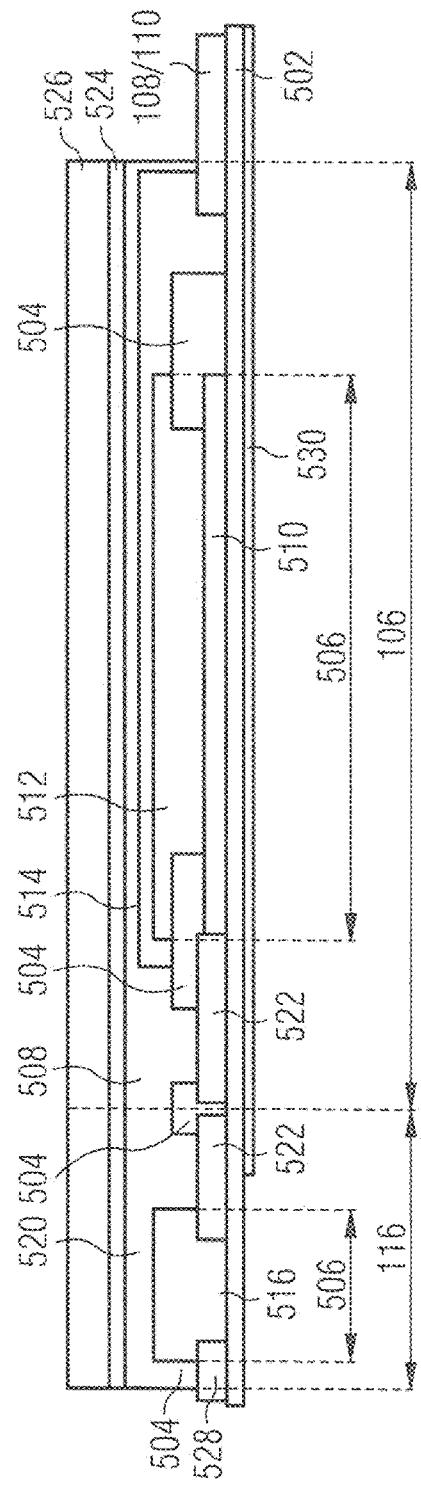

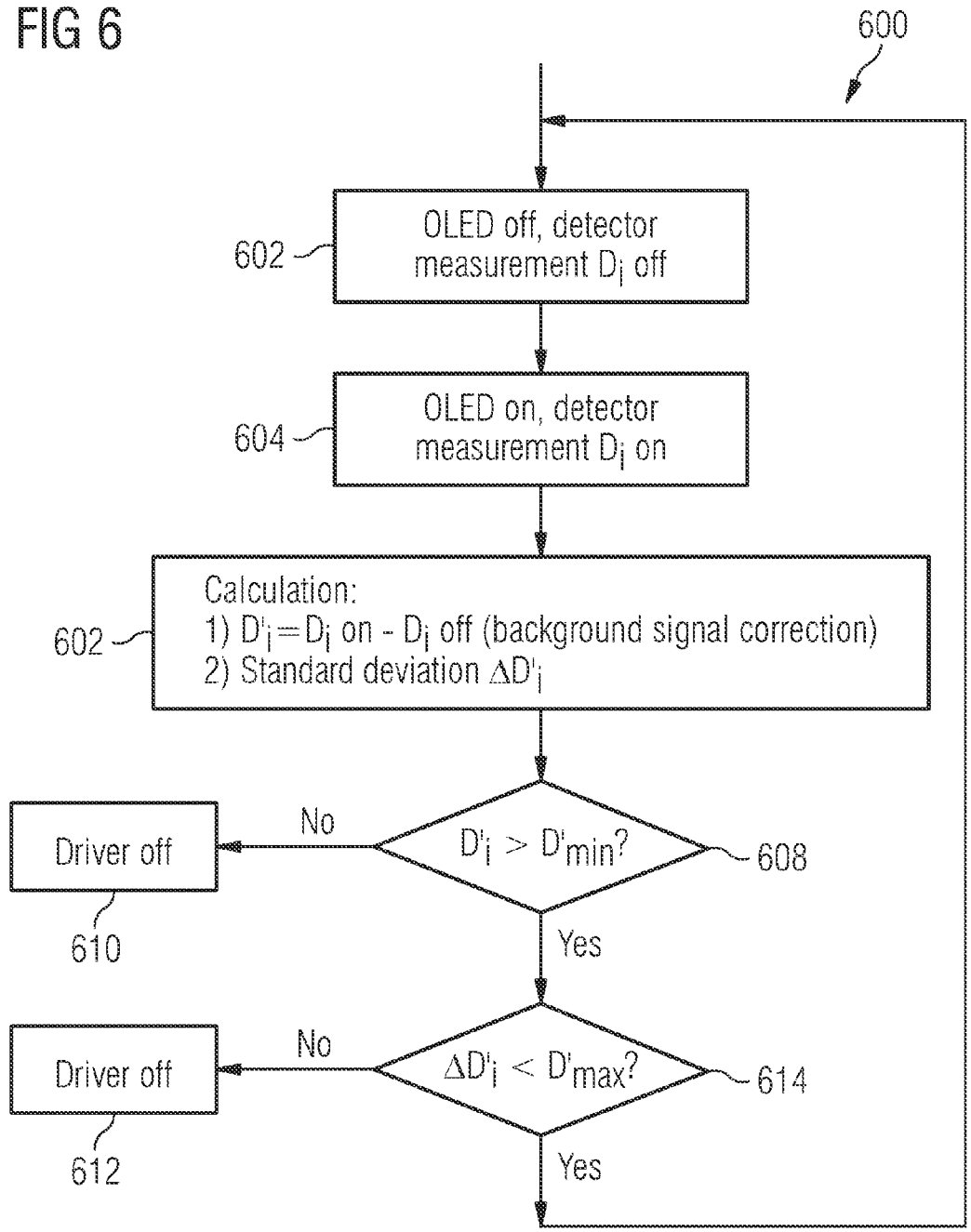

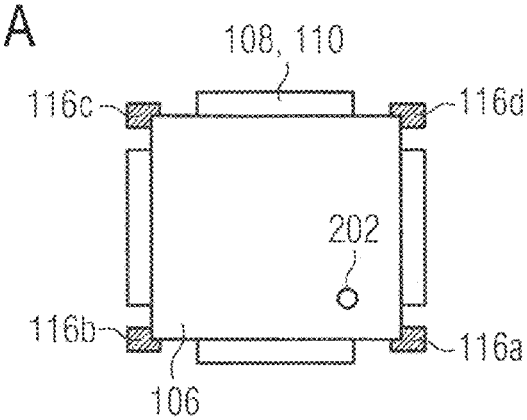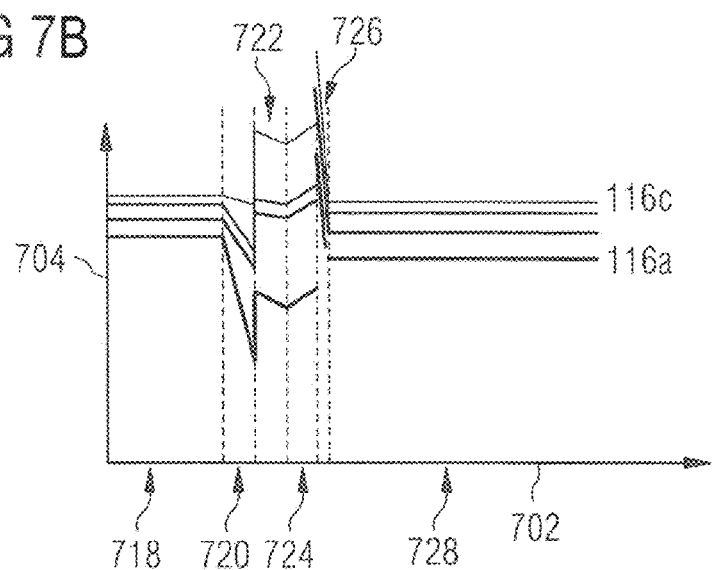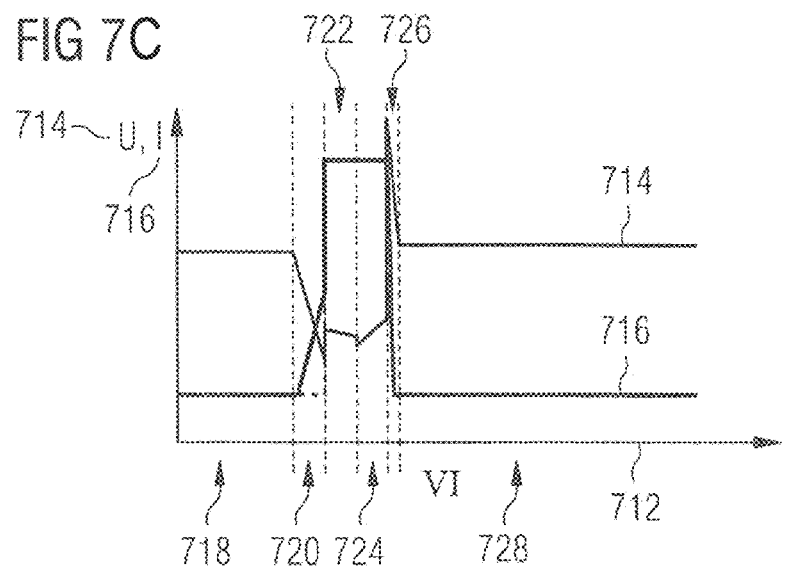

FIG 9A
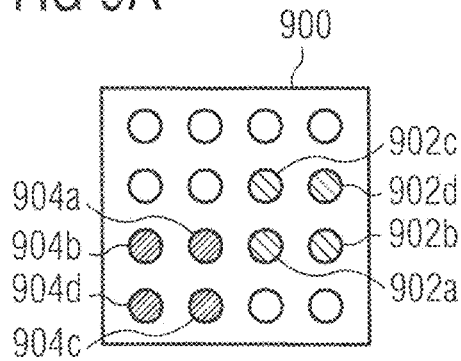
FIG 9B
| | 902a | 902b | 902c | 902d | 904a | 904b | 904c | 904d |
|---|---|---|---|---|---|---|---|---|
| | OLED | | | | Diode | | | |
| | | | | | | | | |
| 906 | 0 | 0 | 0 | 0 | 0,011 | 0,012 | 0,013 | 0,011 |
| 908 | 1 | 1 | 1 | 1 | 0,030 | 0,031 | 0,029 | 0,032 |
| 910 | 1 | 1 | 0 | 0 | 0,029 | 0,028 | 0,027 | 0,030 |
FIG 9C
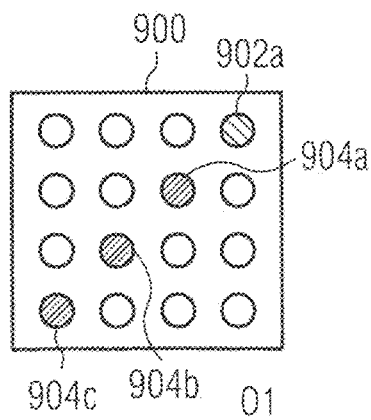
FIG 9D
| 902a | 904a | 904b | 904c |
|---|---|---|---|
| 1 | 0,017 | 0,015 | 0,013 |

OPTOELECTRONIC COMPONENT DEVICE, METHOD FOR PRODUCING AN OPTOELECTRONIC COMPONENT DEVICE AND METHOD FOR OPERATING AN OPTOELECTRONIC COMPONENT DEVICE

RELATED APPLICATIONS

The present application is a national stage entry according to 35 U.S.C. §371 of PCT application No.: PCT/EP2014/063550 filed on Jun. 26, 2014 which claims priority from German application No.: 10 2013 107 855.9 filed on Jul. 23, 2013, and is incorporated herein by reference in its entirety.

TECHNICAL FIELD

In various embodiments, an optoelectronic component device, a method for producing an optoelectronic component device and a method for operating an optoelectronic component device are provided.

BACKGROUND

Optoelectronic components on an organic basis, for example an organic light emitting diode (OLED), are being increasingly widely used in general lighting.

An OLED includes an anode and a cathode with an organic functional layer structure therebetween. The organic functional layer structure may include one or a plurality of emitter layer(s) in which electromagnetic radiation is generated, one or a plurality of charge generating layer structure(s) each composed of two or more charge generating layers (CGL) for charge generation, one or a plurality of hole injection layer(s), one or a plurality of electron injection layer(s), and one or a plurality of electron blocking layer(s), also designated as hole transport layer(s) (HTL), and one or a plurality of hole blocking layer(s), also designated as electron transport layer(s) (ETL), in order to direct the current flow.

The luminance of an OLED is limited, inter alia, by the maximum current density that can flow through the diode. In order to increase the luminance of an OLED, it is known to combine one or a plurality of OLEDs one on top of another in series—so-called stacked OLED or a tandem OLED.

An OLED can age by the influence of harmful environmental influences and/or the diffusion of organic constituents. As a result, the optoelectronic properties of the OLED can vary in the course of operation. During the aging of an OLED, for example, a gradual decrease in luminance and increase in the voltage drop across the OLED can take place. In other words: the efficiency of a conventional OLED decreases during regular operation—illustrated in FIG. 10A and FIG. 10B.

FIG. 10A illustrates a measured voltage drop 1002 and a measured, normalized luminance 1006 as a function of the normalized operating duration 1004 of a conventional OLED. The luminance 1006 is normalized to the luminance of an unused OLED, i.e. at 0% operating duration 1004. The operating duration 1004 is normalized to the time at which the luminance 1006 has fallen to 70% of the original luminance (at 0% operating duration). Furthermore, the lifetime of an OLED can be limited by a change in the voltage drop across the OLED, a change in the uniformity or homogeneity of the luminous area and/or a shift in the color locus.

FIG. 10B illustrates the luminous fields 1010, 1020, 1030 of a conventional OLED. The initially homogeneous luminous image—illustrated in 1010 in FIGS. 10A and 10B—of a conventional OLED becomes only slightly inhomogeneous during the gradual aging on account of the slight current and temperature inhomogeneities during operation.

During the production of an OLED, however, particles 1008 can be included in the layers of the OLED. On account of these particle inclusions 1008, a failure of the OLED can occur during operation, said failure being manifested as a short circuit (short). Almost the entire current can flow away via the included particles 1008—illustrated as a dark spot 1008 in 1020 in FIG. 10B. As a result, the OLED can greatly heat up locally around the short circuit, as a result of which breaking (cracking), melting and/or further degradation of the component can occur. As a result, an abrupt failure of the OLED can occur, as a result of which the operating voltage falls toward zero, illustrated in 1030 in FIGS. 10A and 10B. As is illustrated in 1020 in FIG. 10A, no unambiguous indication of the developing short circuit can be discerned in the voltage drop 1002 and the luminance 1006. In the luminous image, by contrast, a dark spot is clearly formed around the particles 1008, which dark spot can increase further in size and can ultimately lead to the abrupt failure 1030 of the OLED.

Adequate countermeasures against particle inclusions that can limit the lifetime of a conventional OLED as a result of a spontaneous failure have not been available heretofore. Following preliminary tests of an OLED, for example direct or indirect methods for particle screening, for example optical microscopy or thermal measurements, a residual uncertainty with regard to a particle inclusion can nevertheless remain.

Furthermore, in conventional methods, OLEDs are operated with simple driver circuits which enable specific brightnesses to be set. These circuits supply the required electrical power for the operation of the OLED without taking account of changes in the optoelectronic properties in the OLED. In conventional methods, the luminance or the temperature of an OLED is measured and communicated for feedback to the driver circuit in order to compensate for the gradual light aging. In a further conventional method, the gradual decrease in luminance is measured by means of an external photodetector.

SUMMARY

In various embodiments, an optoelectronic component device, a method for producing an optoelectronic component device and a method for operating an optoelectronic component device are provided which make it possible to switch off an optoelectronic component before a particle-induced failure of the optoelectronic component and/or to locate the position of a particle-induced short circuit and to remove the latter.

In the context of this description, an organic substance can be understood to mean a carbon compound which, regardless of the respective state of matter, is present in chemically uniform form and is characterized by characteristic physical and chemical properties. Furthermore, in the context of this description, an inorganic substance can be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) can be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture can be understood to mean something which has constituents consisting of two or more different substances, the constituents of which are very finely dispersed, for example. A substance class should be understood to mean a substance or a substance mixture including one or more organic substance(s), one or more inorganic substance(s) or one or more hybrid substance(s). The term "material" can be used synonymously with the term "substance".

In various embodiments, the term "translucent", "translucent layer" or "translucent substance" can be understood to mean that a layer is transmissive to light, for example to the light generated by the light emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case. Light scattering can be brought about for example by means of scattering centers in the carrier, for example air inclusions, particles having a diameter d50 of greater than 100 nm and a refractive index at least 0.05 greater or less than the refractive index of the carrier.

In various embodiments, the term "transparent", "transparent layer" or "transparent substance" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

In the context of this description, an optoelectronic component can be understood to mean an embodiment of an electronic component, wherein the optoelectronic component includes an optically active region. The optically active region can absorb electromagnetic radiation and form a photocurrent therefrom or emit electromagnetic radiation by means of a voltage applied to the optically active region.

A planar optoelectronic component having two planar, optically active sides can be formed as transparent or translucent, for example, in the connecting direction of the optically active sides, for example as a transparent or translucent organic light emitting diode.

However, the optically active region can also have a planar, optically active side and a planar, optically inactive side, for example an organic light emitting diode designed as a top emitter or bottom emitter. For this purpose, the optically inactive side can be provided with a mirror structure and/or an opaque substance or substance mixture, as a result of which the beam path of the optoelectronic component can be directed.

In various embodiments, an electromagnetic radiation emitting component can be an electromagnetic radiation emitting semiconductor component and/or be formed as an electromagnetic radiation emitting diode, as an organic electromagnetic radiation emitting diode, as an electromagnetic radiation emitting transistor or as an organic electromagnetic radiation emitting transistor.

The radiation can be for example light (in the visible range), UV radiation and/or infrared radiation. In this context, the electromagnetic radiation emitting component can be formed for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing.

In the context of this description, in various embodiments, an organic optoelectronic component can be formed as an organic light emitting diode (OLED), an organic photovoltaic installation, for example an organic solar cell, an organic optical sensor, an organic field effect transistor (OFET) and/or an organic photodiode. The organic field effect transistor can be an all-OFET, in which all the layers are organic. An organic optoelectronic component may include an organic functional layer structure. The organic functional layer structure may include or be formed from an organic substance or an organic substance mixture designed for example for providing an electromagnetic radiation from an electric current provided or for providing an electric current from an electromagnetic radiation provided.

In various embodiments, an optoelectronic component which takes up electromagnetic radiation and generates a photocurrent therefrom can be designated as a photodetector. In various embodiments, a photodetector can be designed for example as a wired photodiode, a surface mounted photodiode (surface mounted device—SMD) or a chip-on-board photodiode (die). Furthermore, a photodetector can be formed as a light emitting diode, for example an organic light emitting diode, which is not energized in action as a photodiode. Furthermore, a photodetector can be formed as a photoconductor, the electrical conductivity or the electrical resistance of which changes with the luminous flux of the electromagnetic radiation taken up. A photoconductor can be an optoelectronic component and should be understood as a special case of an optoelectronic component in the context of this description.

In the context of this description, a semiconductor chip that can take up electromagnetic radiation can be understood as a photodiode chip.

In various embodiments, an optoelectronic component may include for example a semiconductor chip that takes up electromagnetic radiation (wired photodiode, SMD photodiode) or can be designed as a semiconductor chip that takes up electromagnetic radiation, for example as a chip-on-board photodiode.

In various embodiments, a package can be applied and/or formed on or above the semiconductor chip. The package can be formed for example as an encapsulation, an optical lens, a mirror structure and/or as a converter element.

In various embodiments, a mirror structure may include or be formed as an optical grating, a metallic mirror or a mirror, a photonic crystal and/or a total internal reflection interface.

In various embodiments, a wired light emitting diode can be a semiconductor chip that can provide electromagnetic radiation, for example as an LED chip or OLED chip. The semiconductor chip can be encapsulated with a plastic cap, for example. The plastic cap can protect the LED chip or OLED chip against external, harmful influences, for example oxygen and/or water, during manufacture and during operation.

In various embodiments, a surface mounted light emitting diode (SMD) can be an LED chip in a housing. The housing can be physically connected to a substrate.

In various embodiments, a chip-on-board photodiode may include a photodiode chip that is fixed on a substrate, wherein the photodiode chip may include neither a housing nor contact pads. The individual photodiode chips can be applied or formed for example on a substrate, for example on a printed circuit board. The photodiode chips can be wired to the printed circuit board by means of contact pads (wire bonding). The wirings can be carried out by means of gold wires, for example.

In various embodiments, an optoelectronic component device is provided, the optoelectronic component device including: a first optically active structure designed for providing an electromagnetic radiation; a measuring structure designed for determining the luminance distribution of the electromagnetic radiation; wherein the measuring structure is designed to determine the luminance distribution in the first optically active structure, and wherein the measuring structure includes a plurality of second optically active structures, wherein the plurality of second optically active structures are designed as optoelectric components and/or optoelectronic components that take up the electromagnetic radiation provided.

In one embodiment, the first optically active structure can be formed as or include one first optoelectronic component or a plurality of first optoelectronic components.

In one embodiment, the first optoelectronic component can be formed as an organic optoelectronic component.

In one embodiment, the first optoelectronic component can be formed as a surface lighting element.

In one embodiment, the optoelectronic component device can furthermore include a waveguide that is designed for guiding the electromagnetic radiation provided, i.e. is for example a waveguide. A waveguide can be formed from a substance for example in such a way that the waveguide is translucent or transparent to electromagnetic radiation provided, and that the waveguide has reflective interfaces for guiding the electromagnetic radiation.

In one embodiment, the first optically active structure can be optically coupled to the waveguide in such a way that the electromagnetic radiation provided is provided at least partly into the waveguide.

In one embodiment, the measuring structure can be optically coupled to the waveguide in such a way that the electromagnetic radiation provided is taken up by the measuring structure at least partly from the waveguide.

In one embodiment, the measuring structure can be formed in such a way that the measuring structure has a first operating mode and a second operating mode, wherein the measuring structure in the first operating mode provides a further electromagnetic radiation from an electrical voltage or an electric current applied to the measuring structure; and in the second operating mode generates an electric current or an electrical voltage from the electromagnetic radiation that is provided by the first optically active structure and is taken up by the second optically active structure. As a result, in various embodiments, it is possible to switch between the two operating modes during the operation of the first optoelectronic component, such that the second optoelectronic component in the first operating mode contributes to the luminous area of the optoelectronic component device and in the second operating mode can measure the luminance of the at least one first optoelectronic component.

In one embodiment, the first optically active structure and the measuring structure can have in each case at least one optically active side.

In one embodiment, the measuring structure may include identical or different second optically active structures.

In one embodiment, at least one second optically active structure may include or be formed as a photoconductor, a light emitting diode, for example an organic light emitting diode, a photodiode, for example an organic photodiode, or a solar cell, for example an organic solar cell.

In one embodiment, a photoconductor as second optoelectronic component or optoelectric component can be designed for electrically connecting the first optoelectronic component, i.e. as an electric current path of the first optoelectronic component.

In one embodiment, at least one second optically active structure can have a layer cross section substantially identical to that of the first optically active structure.

In one embodiment, the measuring structure may include at least partly a mirror structure in the beam path of electromagnetic radiation in such a way that electromagnetic radiation that is incident directly on the measuring structure is deflected.

In one embodiment, the measuring structure, apart from the optical connection to the waveguide, can be optically isolated, for example surrounded by the mirror structure.

In one embodiment, the waveguide can be formed as transparent or translucent.

In one embodiment, the optoelectronic component device can furthermore include an optical coupling structure between the waveguide and the first optically active structure and/or between the waveguide and the measuring structure. A coupling structure can have for example a refractive index that is between the refractive indices of the layers that are optically connected by means of the coupling structure, or can have a refractive index approximately identical to the refractive index of the layers that are optically connected by means of the coupling structure, for example as an adhesive in accordance with various embodiments. In one embodiment, the first optically active structure and the measuring structure can be formed on a common substrate, wherein the optical coupling structure can be formed for example as an adhesive layer, a barrier thin-film layer, a scattering layer or some other layer that is formed between the waveguide and the first optically active structure and/or the measuring structure.

In one embodiment, the optoelectronic component device can furthermore include a carrier, wherein the first optically active structure and the measuring structure are formed on the carrier.

In one embodiment, the carrier can be formed as transparent or translucent.

In one embodiment, the carrier can be designed as the waveguide.

In one embodiment, the measuring structure can at least partly surround the first optically active structure, for example laterally, concentrically, and/or be formed in an asymmetrical configuration, for example in the optically active side of the first optoelectronic component. In one embodiment, the plurality of second optoelectronic components can be really surrounded for example at least partly by the luminous area of the first optoelectronic component.

In one embodiment, the at least one first optoelectronic component may include at least one optically inactive region, wherein the measuring structure is formed at least partly in the optically inactive region, for example in the geometrical edge region of the at least one first optoelectronic component.

In one embodiment, the second measuring structure may include a larger number of second optically active structures than the geometrical symmetry number of the first optically active structure.

In one embodiment, the configuration of the plurality of second optically active structures can have a different geometrical symmetry number than the geometrical symmetry number of the first optically active structure, for example a larger symmetry number.

In one embodiment, the optoelectronic component device can furthermore include a driver circuit, wherein the driver circuit is electrically connected to the first electrically active region and the second electrically active region.

In one embodiment, the driver circuit can be designed for driving the first optically active structure and the measuring structure, for example for switching between the operating modes of the plurality of second optoelectronic components and/or for energizing the at least one first optoelectronic component.

In one embodiment, the driver circuit can be designed in such a way that the optically active structures are drivable individually and/or in groups.

In one embodiment, the driver circuit can be electrically connected to a readable and/or a writable memory.

In one embodiment, the driver circuit can be designed for energizing the first optically active structure.

In one embodiment, the first optically active structure can be electrically insulated from the measuring structure.

In one embodiment, the driver circuit can be formed in such a way that the operating parameters of the first optically active region are set by means of the at least one measurement parameter of the measuring structure.

In various embodiments, a method for producing an optoelectronic component device is provided, the method including: forming a first optically active structure for providing an electromagnetic radiation; forming a measuring structure for determining the luminance distribution of the electromagnetic radiation, wherein the measuring structure is formed in such a way that the luminance distribution in the first optically active structure is determined, and wherein the measuring structure is formed in a manner including a plurality of second optically active structures, wherein the plurality of second optically active structures are formed as optoelectric components and/or optoelectronic components that take up the electromagnetic radiation provided.

In one embodiment of the method, the first optically active structure can be formed as or include one first optoelectronic component or a plurality of first optoelectronic components.

In one embodiment of the method, the first optoelectronic component can be formed as an organic optoelectronic component.

In one embodiment of the method, the first optoelectronic component can be formed as a surface lighting element.

In one embodiment of the method, the method can furthermore include providing a waveguide designed for guiding the electromagnetic radiation provided. The waveguide can be for example a common substrate for the first optically active structure and the measuring structure, wherein the substrate is designed as a waveguide.

In one embodiment of the method, the first optically active structure can be optically coupled to the waveguide in such a way that the electromagnetic radiation provided is provided at least partly into the waveguide.

In one embodiment of the method, the measuring structure can be optically coupled to the waveguide in such a way that the electromagnetic radiation provided is taken up by the measuring structure at least partly from the waveguide.

In one embodiment of the method, the measuring structure can be formed in such a way that the measuring structure has a first operating mode and a second operating mode, wherein the measuring structure in the first operating mode provides a further electromagnetic radiation from an electrical voltage or an electric current applied to the measuring structure; and in the second operating mode generates an electric current or an electrical voltage from the electromagnetic radiation that is provided by the first optically active structure and is taken up by the second optically active structure.

In one embodiment of the method, the first optically active structure and the measuring structure can be formed in such a way that they have in each case at least one optically active side.

In one embodiment of the method, forming the measuring structure may include forming identical or different second optically active structures.

In one embodiment of the method, at least one second optically active structure can be formed as a photoconductor, a light emitting diode, for example organic light emitting diode, a photodiode, for example an organic photodiode, or a solar cell, for example an organic solar cell.

In one embodiment of the method, at least one second optically active structure can be formed with a layer cross section substantially identical to that of the first optically active structure.

In one embodiment of the method, forming the measuring structure may include forming a mirror structure in the beam path of electromagnetic radiation in such a way that electromagnetic radiation that is incident directly on the measuring structure is deflected.

In one embodiment of the method, the measuring structure can be formed in such a way that the measuring structure, apart from the optical connection to the waveguide, is optically isolated, for example is surrounded by the mirror structure.

In one embodiment of the method, the waveguide can be formed as transparent or translucent.

In one embodiment of the method, the method can furthermore include forming an optical coupling structure between the waveguide and the first optically active region and/or between the waveguide and the measuring structure. An optical coupling structure may include or be formed from a transparent or translucent substance, for example. The coupling structure can have a refractive index that is between the refractive index of the optoelectronic component and the refractive index of the waveguide. The coupling structure may include for example an adhesive, an immersion liquid or an immersion gel.

In one embodiment of the method, the method can furthermore include providing a carrier, wherein the first optically active structure and the measuring structure are formed on the carrier.

In one embodiment of the method, the carrier can be formed as transparent or translucent.

In one embodiment of the method, the carrier can be designed as the waveguide.

In one embodiment of the method, the measuring structure can be formed in such a way that the measuring structure at least partly surrounds the first optically active structure, for example laterally, concentrically and/or in an asymmetrical configuration.

In one embodiment of the method, forming the at least one first optoelectronic component may include forming at least one optically inactive region, wherein the measuring structure is formed at least partly in the optically inactive region.

In one embodiment of the method, the measuring structure can be formed in such a way that the measuring structure includes a larger number of second optically active structures than the geometrical symmetry number of the first optically active structure.

In one embodiment of the method, the measuring structure can be formed in such a way that the configuration of the plurality of second optically active structures has a different geometrical symmetry number than the geometrical symmetry number of the first optically active structure, for example a larger symmetry number.

In one embodiment of the method, the method can furthermore include connecting the first optically active structure and the measuring structure to a driver circuit.

In one embodiment of the method, the driver circuit can be designed for controlling the first optically active structure and the measuring structure.

In one embodiment of the method, the driver circuit can be designed in such a way that the plurality of second optically active structures are drivable individually and/or in groups.

In one embodiment of the method, the driver circuit can be electrically connected to a readable and/or a writable memory.

In one embodiment of the method, the driver circuit can be designed for energizing the first optically active structure.

In one embodiment of the method, the first optically active structure can be formed in a manner electrically insulated from the measuring structure.

In one embodiment of the method, the driver circuit can be formed in such a way that the operating parameters of the first optically active structure are set by means of the at least one measurement parameter of the measuring structure.

In various embodiments, a method for operating an optoelectronic component device described above is provided, the method including: measuring the measurement parameters of the measuring structure while the first optically active structure is optically inactive; measuring the measurement parameters of the measuring structure while the first optically active structure is optically active; determining the respective differences between the measurement parameters of the plurality of second optically active structures of the measuring structure with the first optically active structure being optically active and the measurement parameters with the first optically active structure being optically inactive; setting at least one operating parameter of the optically active structure on the basis of the measurement parameter differences among the plurality of second optically active structures.

During the process of measuring the signals of the plurality of second optoelectronic components, the latter are operated for taking up the electromagnetic radiation of the at least one first optoelectronic component.

In one embodiment of the method, setting the at least one operating parameter may include changing the at least one operating parameter from a first operating parameter set to a second operating parameter set if the plurality of second optoelectronic component have a difference in the signal differences that is greater than a first trigger absolute value.

In one embodiment of the method, setting the at least one operating parameter may include changing the at least one operating parameter from a first operating parameter set to a third operating parameter set if the plurality of second optoelectronic components have on average a signal difference that is less than a second trigger absolute value.

In one embodiment of the method, an operating parameter set may include an operating current, an operating voltage and/or a luminance of the first optically active structure.

In one embodiment of the method, the second operating parameter set can overdrive the first optically active structure in such a way that the operating current, the operating voltage and/or the luminance are/is increased.

In one embodiment of the method, the overdriving may include one or a plurality of current and/or voltage pulses.

In one embodiment of the method, the third operating parameter set can switch the at least one optoelectronic component to be optically inactive.

In one embodiment of the method, measuring the measurement parameters can be designed as continuous measurement, discontinuous measurement and/or as through-switching measurement of the measurement parameters of the measuring structure (multiplexing).

In the case of continuous measurement, the measuring structure can measure measurement parameters without temporal interruption. In the case of discontinuous measurement, the measurement parameters can be measured periodically or on the basis of an external control signal. Periodic discontinuous measurement can be carried out for example in a pulsed or clocked manner. In the case of through-switching measurement, in the case of a measuring structure including a plurality of second optically active structures, the measurement parameters of the second optically active structures can be measured in part simultaneously and/or successively.

In one embodiment, in the operating mode with through-switching measurement, the second optically active structures that measure no measurement parameters can be optically inactive or can be operated for providing electromagnetic radiation. In other words: the second optically active structures that are not operated for measurement can be switched off or operated like the first optically active structure.

In one embodiment, the driver circuit can be formed in such a way that the operating parameters of the first electrically active region are set by means of the operating parameters of the second electrically active region.

In one embodiment of the method, the first trigger absolute value and/or the second trigger absolute value can be set in a variable manner. As a result, by way of example, by means of adapting the first trigger absolute value and/or the second trigger absolute value, it is possible to set the aging compensation of the optoelectronic properties of the first optically active structure.

In one embodiment of the method, in the case of discontinuous measurement and/or through-switching measurement, the temporal parameter, i.e. the temporal interval between the individual measurements of the measurement parameters of the second optically active structures, can be designed in such a way that an incorrect detection of the optoelectronic properties of the first optically active structure can be prevented, for example in the case of areally different aging of the first optically active structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 1 shows a schematic illustration of an optoelectronic component device in accordance with various embodiments;

FIGS. 4A-4D show schematic illustrations of an optoelectronic component device, in accordance with various embodiments;

FIGS. 5A-5B show schematic cross-sectional views of optoelectronic component devices, in accordance with various embodiments;

FIG. 6 shows a schematic illustration of a method for operating an optoelectronic component device, in accordance with various embodiments;

FIGS. 7A-7C show a schematic illustration of a method for operating an optoelectronic component device, in accordance with various embodiments;

FIGS. 9A-9D show various illustrations concerning the operation of an optoelectronic component device, in accordance with various embodiments.

DETAILED DESCRIPTION

Figure 2A:
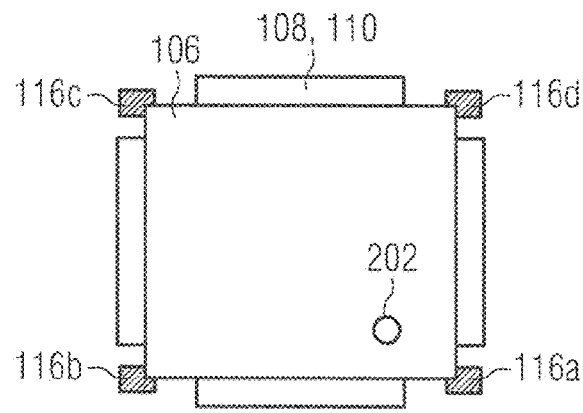
FIGS. 2A-2C show schematic illustrations of an optoelectronic component device in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

FIG. 1 shows a schematic illustration of an optoelectronic component device, in accordance with various embodiments.

An optoelectronic component device 100 including a first optically active structure 106, a measuring structure 116 and a driver circuit 104 is illustrated schematically.

The measuring structure 116 may include a plurality of second optically active structures 116$i$, wherein i is an index that indicates an optically active structure and includes a consecutive letter, for example 116$a$, 116$b$, 116$c$, ..., 116$z$, 116$aa$, ..., 116$zz$, 116$aaa$, etc.

In figures, in the embodiments, a first optically active structure 106 is illustrated on the basis of the example of a first optoelectronic component 106, for example an organic light emitting diode 106, and should therefore be understood synonymously with a first optically active structure 106 for general embodiments.

In figures, in the embodiments, a measuring structure 116 is illustrated on the basis of the example including a plurality of second optically active structures 116$i$, for example second optoelectronic components 116$i$, for example photodetectors 116$i$, and should therefore be understood synonymously with the measuring structure 116 including a plurality of second optically active structures 116$i$ for general embodiments. A second optically active structure 116$i$ can be formed for example as a photoconductor 116$i$, a photodiode 116$i$, a phototransistor 116$i$ and/or a photothyristor 116$i$. A photoconductor may include or be formed from, for example, a substance in which at least one electrical property changes by means of absorbed electromagnetic radiation.

In the schematic embodiment illustrated in FIG. 1, the optoelectronic component device 100 includes a square, first optoelectronic component 106, for example an organic light emitting diode 106, and a measuring structure 116 in the form of photodetectors that are positioned in the corners of the organic light emitting diode 106.

The illustration furthermore shows electrical terminals 108, 110 and electrical connections 112, 114, by which the OLED 106 is electrically connected to the driver circuit 104. The OLED 106 can be electrically energized by the driver circuit 104 and provides electromagnetic radiation. The electromagnetic radiation, for example light, is emitted into an optical waveguide. An optical waveguide can be formed as a glass substrate, for example, on which the OLED 106 is formed.

The photodetectors 116$i$ of the measuring structure 116 can have at least one optically active side and can be designed to generate an electric current from an absorbed electromagnetic radiation. The electric current generated by the photodetectors 116$i$ can also be designated hereinafter as photocurrent, measurement parameter or signal.

The illustration furthermore shows how the photodetectors 116$i$ of the measuring structure 116 are electrically connected to the driver circuit 104 by means of an electrical signal line 118. The photodetectors 116$i$ can thereby provide a signal $D_i$ to an input of the driver circuit 104.

The photodetectors 116$i$ can be positioned with respect to the OLED 106 in such a way that the photodetectors 116$i$ of the measuring structure 116 can generate an electric current from the light that is emitted by the OLED 106. In this case, owing to the light modes guided in the glass substrate, the photodetectors can also even detect light that was emitted with a distance of a plurality of centimeters between the photodetectors and the region of the OLED 106.

In the case of a non-aged OLED 106, the photodetectors 116$i$ yield identical signals ($D_i$=D1, D2, D3, D4). A non-aged OLED 106 is, for example, an OLED 106 shortly after production without prior operation (operating duration 1004 0%—see FIG. 10A).

Figure 10A:
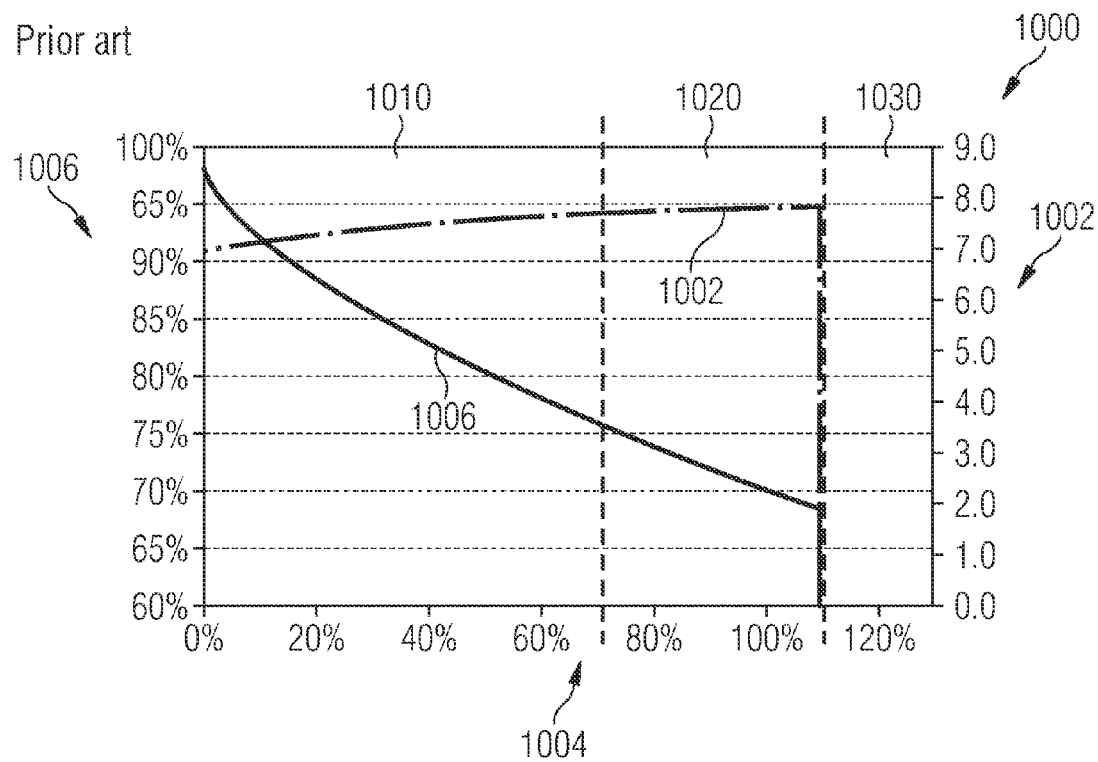
FIGS. 10A-10B show illustrations concerning the aging of a conventional OLED.
Figure 10B:
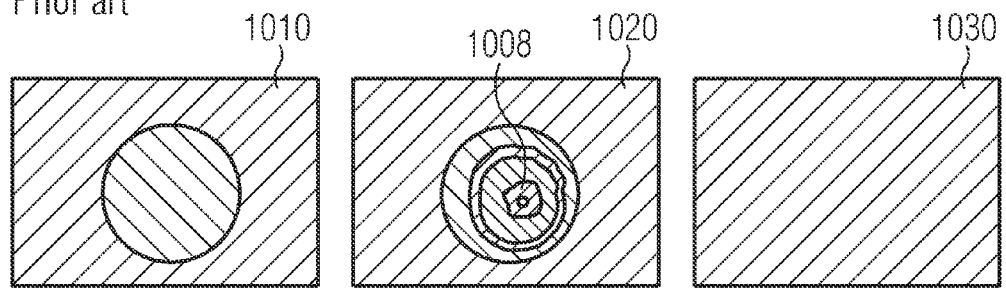

A short circuit in a region of the OLED 106 can lead to a darker region in the optically active area of the OLED 106 since the region of the OLED 106 around the short circuit can no longer emit light (see 1020 in FIG. 10B). A short circuit can therefore lead to a reduction of the signal $D_i$ of the photodetectors 116$i$ in whose detection region the short circuit is situated. A short circuit can slowly increase in size until the majority of the current provided by the driver circuit 104 for the OLED 106 flows via the short circuit. This can lead to melting and sudden failure of the OLED 106 (see 1030 in FIGS. 10A and 10B).

Therefore, a reduction of the signal $D_i$ of one of the photodetectors 116$i$ yields a clear indication of a short circuit increasing in size. For a reliable measurement (short-circuit identification), the photodetectors 116$i$ can be laterally distributed or configured with respect to the OLED 106 in such a way that they are formed at the geometrical edge of the luminous area of the OLED 106, for example in the optically inactive region, such that the absolute value of the luminous area of the OLED 106 is not reduced. Furthermore, the photodetectors 116$i$ can be laterally distributed with respect to the OLED 106 in such a way that the photodetectors 116$i$ are arranged at geometrical points at which comparable luminance relationships are present on account of the lateral current and heat distribution. The photodetectors 116$i$ should be formed and arranged in such a way that they do not adversely influence the feeding-in of current to the OLED 106.

The organic light emitting diode 106 can be designated as a first optoelectronic component 106, wherein electrical connections for the area energization of the organic functional layer structure (see FIGS. 5A and 5B) of the organic light emitting diode 106 can be formed in/on the optically active side of the organic light emitting diode 106. As a result, the organic light emitting diode 106 could also be interpreted as a plurality or multiplicity of first optoelectronic components 106.

In the context of this description, the optically active side of the at least one first optoelectronic component 106 can be designated as luminous area of the at least one first optoelectronic component 106.

The measuring structure 116 may include a plurality of second optoelectronic components 116$i$ or a plurality of second optically active structures 116$i$. A selection of possible embodiments of the photodetectors 116$i$ and the configurations thereof are illustrated in the embodiments in FIGS. 3A-3C, 4A-4D and 5A-5B.

Figure 2B:
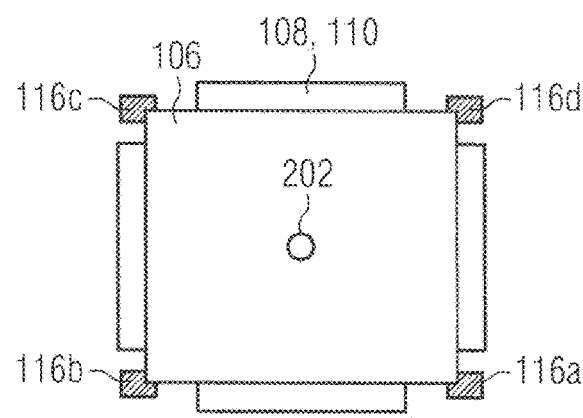
Figure 2C:
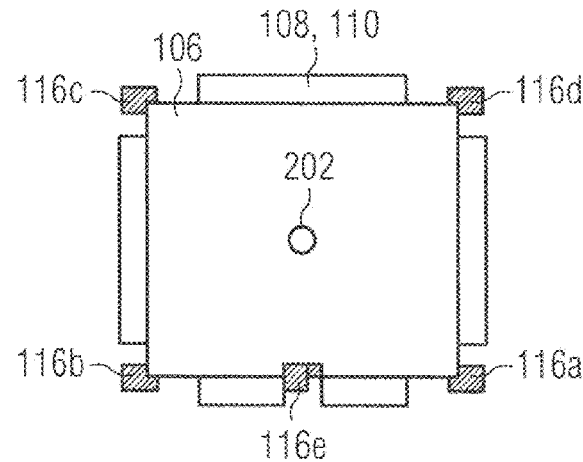

FIGS. 2A-2C show schematic illustrations of an optoelectronic component device, in accordance with various embodiments.

The illustrations show embodiments of the arrangement of photodetectors 116$i$ in accordance with FIG. 1, for example for avoiding incorrect interpretations in the case of particle-induced dark spots (short circuits) in the luminous area of the OLED 106.

FIG. 2A shows a particle-induced dark spot 202 of an OLED 106. The dark spot 202 is closer to some of the photodetectors 116$a$, 116$b$, 116$c$, 116$d$ than to others. As a result, the (four illustrated) photodetectors 116$a$, 116$b$, 116$c$, 116$d$ indicate different signal values $D_i$ (D1, D2, D3, D4). Indication of a signal $D_i$ can be understood as formation of a photocurrent $D_i$, wherein the photocurrent $D_i$ will be present, i.e. is indicated, at the driver circuit 104.

From the signals D1, D2, D3, D4 of the photodetectors 116$a$, 116$b$, 116$c$, 116$d$, it is possible to draw a conclusion about the presence of a short circuit; by way of example, the position of the short circuit can be determined. The short circuit can be healed for example in a further method step by means of a laser and/or overdriving.

After locating the short circuit, for example by means of triangulation, it is possible to anneal the short circuit. For this purpose, the temperature is increased by means of a supply of energy, with the result that organic substances degrade and become electrically insulating. The energy can be supplied electrically by overdriving or optically by means of a laser.

A dark spot 202 formed at a center of symmetry of the OLED 106 (illustrated in FIG. 2B) can have the effect that the photodetectors 116$a$, 116$b$, 116$c$, 116$d$ indicate an identical signal $D_i$. However, the absolute value of the signal is lower than in the case of an operating duration 1004 of 0% (see FIG. 10A).

In various embodiments, the photodetectors 116$a$, 116$b$, 116$c$, 116$d$ should be positioned or formed with respect to the OLED 106 in such a way that at any location of the luminous area of the OLED 106 a possible particle 202 cannot act as a center of symmetry, for example not simultaneously for all the photodetectors 116$a$, 116$b$, 116$c$, 116$d$. For this purpose, the optoelectronic component device may include for example a larger number of second optoelectronic components and/or the plurality of second optoelectronic components can have a different geometrical symmetry than the geometrical symmetry of the OLED 106. In one embodiment of the optoelectronic component device, for example, provision can be made of a further photodetector 116$e$ as monitoring detector with respect to a dark region 202 at a center of symmetry of the OLED—illustrated in FIG. 2C. In this embodiment, the optoelectronic component device includes five second optoelectronic components 116 and the OLED 106 has a four-fold geometrical symmetry.

In one embodiment of the optoelectronic component device, one or a plurality of the photodetectors 116$i$ can have two operating modes, for example the further photodetector 116$e$. In one operating mode (emitter function), the further photodetector 116$e$ can be used as a light emitting diode 116$e$ (see FIGS. 5A and 5B). In other words: the further photodetector 116$e$ can contribute to increasing the luminous area. In another operating mode (detector function), the further photodetector 116$e$ provides a signal D5. It is thereby possible to determine a dark region 202 at a center of symmetry of the OLED 106 (see FIG. 2B). In one embodiment, it is possible to switch between the first operating mode and the second operating mode of the further photodetector 116$e$, for example dynamically, for example in an automated manner, for example by means of the driver circuit 104.

Figure 3A:
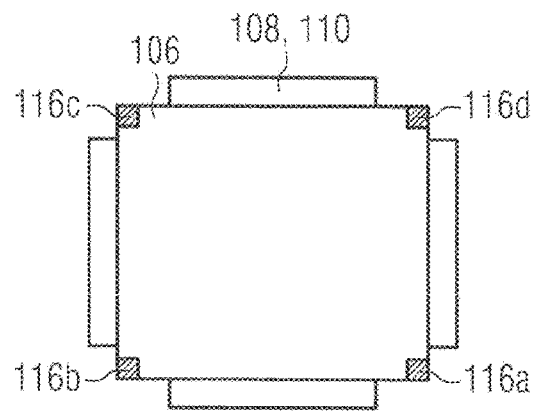
FIGS. 3A-3C show schematic illustrations of an optoelectronic component device in accordance with various embodiments.
Figure 3B:
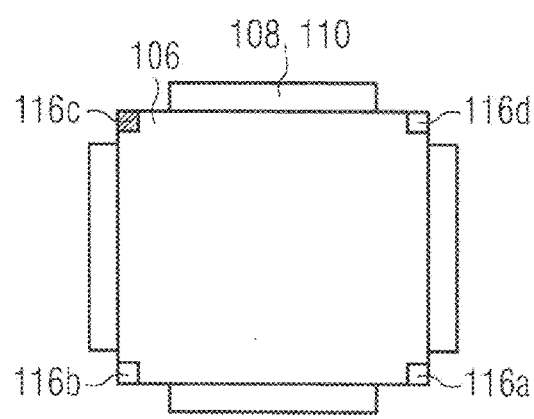
Figure 3C:
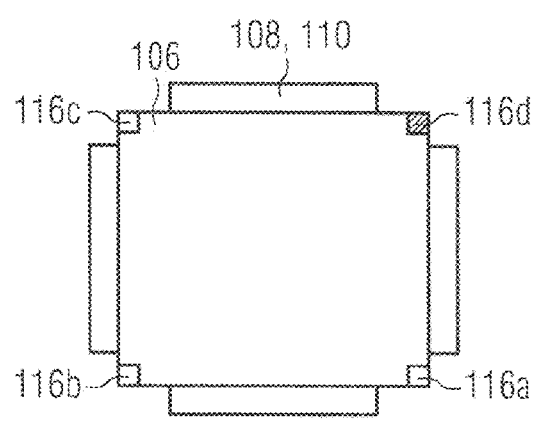

FIGS. 3A-3C show schematic illustrations of an optoelectronic component device in accordance with various embodiments.

Schematic illustrations of an optoelectronic component device in accordance with either of the descriptions of FIGS. 1 and 2A-2C are illustrated.

In one embodiment, the optoelectronic component device may include four photodetectors 116$a$, 116$b$, 116$c$, 116$d$ in a manner similar to the embodiment in FIGS. 1, 2A, 2B, wherein the photodetectors 116$a$, 116$b$, 116$c$, 116$d$ have a first operating mode and a second operating mode, in a manner similar to the further photodetector 116$e$ of the embodiment in the description of FIG. 2C. In one embodiment, different switching scenarios can be realized by means of the possibility of switching over between the operating modes (see description of FIG. 2C) of the photodetectors 116$a$, 116$b$, 116$c$, 116$d$.

In one embodiment (illustrated in FIG. 3A), the photodetectors 116$a$, 116$b$, 116$c$, 116$d$ can be switched in detector function.

In one embodiment (illustrated in FIG. 3B), one photodetector 116c can be switched in detector function while the other photodetectors 116a, 116b, 116d are switched in emitter function or are optically inactive. The optically inactive state can be understood as a special case of the detector function in which the signal is not read out or processed.

By means of the different switching-over possibilities for the photodetectors 116a, 116b, 116c, 116d, the absolute value of the luminous area can be increased and the photodetectors 116a, 116b, 116c, 116d can act reciprocally as monitoring detectors.

A monitoring detection can be carried out, for example, by a different photodetector than the photodetector 116c (illustrated: photodetector 116d in FIG. 3C) being switched in detector function while the other photodetectors 116a, 116b, 116c are switched in emitter function.

Furthermore, flicker of the luminous area of the optoelectronic component device can be prevented by means of switching through the operating modes of the plurality of photodetectors 116i.

FIGS. 4A-4D show schematic illustrations of an optoelectronic component device, in accordance with various embodiments.

FIGS. 4A-4D illustrate different geometrical embodiments of an optoelectronic component device in accordance with one of the descriptions of FIGS. 1, 2A-2C and 3A-3C.

In one embodiment, the OLED 106 can have a circular, optically active side (luminous area) (illustrated in FIG. 4A). The photodetectors 116i and electrical terminals 108, 110 can surround the optically active side of the OLED. In various embodiments, the electrical terminals 108, 110 can be optically inactive. In various embodiments, one photodetector 116 can be formed between two electrical terminals 108, 110.

In various embodiments, the OLED 106 can have a square shape (illustrated in FIG. 4B), a rectangular shape (illustrated in FIG. 4C), a round shape, a polygonal shape or a geometrical mixed shape, for example in the case of scalable shapes.

In various embodiments, at least one portion of the photodetectors 116i can be formed in an optically inactive region of the OLED 106, for example in the region or as part of the electrical terminals 108, 110. In various embodiments, one portion of the photodetectors 116i can have an operating mode as LED for emitting and an operating mode for detecting the luminance of the OLED 106. In various embodiments, at least one portion of the photodetectors 116i can be formed as a region of the electrical terminals 108, 110, for example as photoconductor 116, or can be surrounded by in each case two electrical terminals 108, 110, wherein the two electrical terminals 108, 110 can have an identical or a different polarity (illustrated in FIG. 4D).

In other words: the photodetectors 116i integrated in the optoelectronic component device can be arranged and formed at measurement points chosen in such a way, and/or can be calibrated to a value in such a way, that they measure comparable signals in the case of a non-aged OLED 106, i.e. generate similar photocurrents and detect the luminance of the OLED 106 in a largest possible region of the luminous area.

FIGS. 5A and 5B show schematic cross-sectional views of optoelectronic component devices, in accordance with various embodiments.

Schematic cross-sectional views of an optoelectronic component device in accordance with one of the descriptions of FIGS. 1, 2A-2C, 3A-3C and 4A-4D are illustrated.

In various embodiments, an optoelectronic component device may include a first optoelectronic component 106 and a second optoelectronic component 116. The first optoelectronic component 106 can be designed for providing electromagnetic radiation and the second optoelectronic component 116 can be designed for taking up and/or providing electromagnetic radiation.

In one embodiment, the first optoelectronic component 106 can be formed as a light emitting component 106, for example in the form of an organic light emitting diode 106. In one embodiment, the second optoelectronic component 116 can be formed as a light absorbing component 116, for example in the form of a photodetector 116, a photodiode 116, a solar cell 116, a photoconductor or a non-energized light emitting diode 116.

In one embodiment, in which the second optoelectronic component 116 is formed as a non-energized light emitting diode, the photodetector 116 can have a layer cross section substantially identical to that of the first optoelectronic component 106, but can be electrically insulated from the latter and, in addition, can be optically isolated apart from the optical connection to the carrier 502.

In various embodiments, the first optoelectronic component 106 and the second optoelectronic component 116 can be formed on or above a common carrier 502.

In one embodiment, the carrier 502 can be formed as a waveguide of the electromagnetic radiation of the first optoelectronic component 106 and of the second optoelectronic component 116, for example in a manner transparent or translucent with respect to the provided electromagnetic radiation of the first optoelectronic component 106 and of the second optoelectronic component 116.

In various embodiments, the first optoelectronic component 106 and the second optoelectronic component 116 may include an optically active region 506.

In various embodiments, the organic light emitting diode 106 (or else the light emitting components in accordance with the embodiments described above or those that will be described below) can be designed as a so-called top and bottom emitter. A top and/or bottom emitter can also be designated as an optically transparent or translucent component, for example a transparent or translucent organic light emitting diode 106.

The illustration furthermore shows in the region of the OLED 106: a first electrode 510 formed on or above the carrier 502. An organic functional layer structure 512 is illustrated on or above the first electrode 510. A second electrode 514 is illustrated above or on the organic functional layer structure 512. The second electrode 514 is electrically insulated from the first electrode 510 by means of an electrical insulation 504. The second electrode 514 can be physically and electrically connected to an electrical terminal 108, 110. In various configurations, an electrical terminal 108, 110 can also be designated as a contact pad 108, 110.

The first electrode 510 can be physically and electrically connected to an electrical connection layer 522. The electrical connection layer 522 can be formed in the geometrical edge region of the optically active region 506 of the OLED 106 on or above the carrier 502, for example laterally alongside the first electrode 510. The electrical connection layer 522 is electrically insulated from the second electrode 514 by means of a further electrical insulation 504. The electrical connection layer 522 can shift the electrical connection of the first electrode 510 into the geometrical edge region of the optoelectronic component device (not illustrated).

A barrier thin-film layer 508 can be arranged on or above the second electrode 514 in such a way that the second electrode 514, the electrical insulations 504 and the organic functional layer structure 512 are surrounded by the barrier thin-film layer 508, i.e. are enclosed in the combination of the barrier thin-film layer 508 with the carrier 502.

In the context of this description, a "barrier thin-film layer" 108 or a "barrier thin film" 108 can be understood to mean, for example, a layer or a layer structure which is suitable for forming a barrier against chemical impurities or atmospheric substances, in particular against water (moisture) and oxygen. In other words, the barrier thin-film layer 108 is formed in such a way that OLED-damaging substances such as water, oxygen or solvent cannot penetrate through it or at most very small proportions of said substances can penetrate through it.

An adhesive layer 524 can be arranged on or above the barrier thin-film layer 508 in such a way that the adhesive layer 524 seals the barrier thin-film layer 508 areally and hermetically with respect to harmful environmental influences. A cover 526 is arranged on or above the adhesive layer 524. The cover 526 can be adhesively bonded, for example laminated, for example onto the barrier thin-film layer 508 by means of an adhesive 524. The cover 526 can be formed for example as a glass cover, a metal cover and/or plastic cover. The cover 526 can be for example structured, for example as a cavity glass.

The barrier thin-film layer 508 and/or the cover 526 can be formed in such a way that the enclosed layers are hermetically sealed with respect to harmful environmental influences, for example with regard to water and/or oxygen.

Approximately the region of the optoelectronic component 500 with organic functional layer structure 512 on or above the carrier 502 can be designated as optically active region 506. Approximately the region of the optoelectronic component 500 without organic functional layer structure 506 on or above the carrier 502 can be designated as optically inactive region. The optically inactive region can be arranged for example areally alongside the optically active region 512. The optically inactive region may include for example contact pads 108, 110 or insulator layers for electrically contacting the organic functional layer structure 512. In other words: in the geometrical edge region, the optoelectronic component 106 can be formed in such a way that contact pads 108, 110 are formed for electrically contacting the optoelectronic component 106, for example by virtue of electrically conductive layers, for example electrical connection layers 522, electrodes 510, 514 or the like, being at least partly exposed in the region of the contact pads 108, 110.

In various embodiments, a barrier layer 530 can optionally be arranged on or above the carrier 502, for example on the side of the organic functional layer structure 512 and/or on the side facing away from the organic functional layer structure 512 (illustrated).

In various embodiments, a further cover (not illustrated) can be provided on or above the barrier layer 530 and/or the barrier layer 530 can be formed as a further cover, for example as a cavity glass encapsulation.

A part of the electrically active region of the light emitting component 106 can be arranged on or above the carrier 502. The electrically active region can be understood as that region of the light emitting component 106 in which an electric current for the operation of the light emitting component 106 flows. In various embodiments, the electrically active region may include the first electrode 510, the second electrode 514 and the organic functional layer structure 512, as are explained in even greater detail below.

The carrier 502 can serve for example as a carrier element for electronic elements or layers, for example light emitting elements. By way of example, the carrier 502 may include or be formed from glass, quartz and/or a semiconductor material or any other suitable substance. Furthermore, the carrier 502 may include or be formed from a plastics film or a laminate including one or including a plurality of plastics films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). The carrier 502 may include one or more of the substances mentioned above.

The carrier 502 may include or be formed from a metal, for example copper, silver, gold, platinum, iron, for example a metal compound, for example steel.

A carrier 502 including a metal or a metal compound can also be embodied as a metal film or a metal-coated film.

The carrier 502 can be embodied as translucent or even transparent. In the case of a carrier 502 including a metal, the metal can be formed for example as a thin layer, transparent or translucent layer, and/or the metal can be part of a mirror structure.

The carrier 502 may include or be formed as a mechanically rigid region and/or a mechanically flexible region. A carrier 502 including a mechanically rigid region and a mechanically flexible region can be for example structured, for example by virtue of the rigid region and the flexible region having a different thickness.

A mechanically flexible carrier 502 or the mechanically flexible region can be formed for example as a film, for example a plastics film, metal film or a thin glass.

The barrier layer 530 may include or consist of one or more of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof. In various embodiments, the barrier layer can be formed by means of an atomic layer deposition (ALD) method and/or a molecular layer deposition (MLD) method. In various embodiments, the barrier layer may include two or more identical and/or different layers, or plies, for example alongside one another and/or one above another, for example as a barrier layer structure or a barrier stack, for example in a structured manner.

Furthermore, in various embodiments, the barrier layer can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

In various embodiments, the first electrode 510 (for example in the form of a first electrode layer 510) can be applied on or above the barrier layer 530 (or, if the barrier layer is not present (illustrated), on or above the carrier 502). The first electrode 510 (also designated hereinafter as bottom electrode 510) can be formed from an electrically conductive substance, such as, for example, a metal or a transparent conductive oxide (TCO) or a layer stack including a plurality of layers of the same metal or different metals and/or the same TCO or different TCOs. Transparent conductive oxides are transparent conductive substances, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 510 may include a metal; for example Ag, Pt, Au, Mg, Al, Ba, In, Cr, Mo, Ca, Sm or Li, and compounds, combinations or alloys of these substances.

In various embodiments, the first electrode 510 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode 510 may include one or a plurality of the following substances as an alternative or in addition to the abovementioned substances: networks composed of metallic nanowires and nanoparticles, for example composed of Ag; networks composed of carbon nanotubes; graphene particles and graphene layers; networks composed of semiconducting nanowires.

Furthermore, the first electrode 510 may include electrically conductive polymers or transition metal oxides or transparent electrically conductive oxides.

In various embodiments, the first electrode 510 and the carrier 502 can be formed as translucent or transparent. In the case where the first electrode 510 includes or is formed from a metal, the first electrode 510 can have for example a layer thickness of less than or equal to approximately 25 nm, for example a layer thickness of less than or equal to approximately 20 nm, for example a layer thickness of less than or equal to approximately 18 nm. Furthermore, the first electrode 510 can have for example a layer thickness of greater than or equal to approximately 10 nm, for example a layer thickness of greater than or equal to approximately 15 nm. In various embodiments, the first electrode 510 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 510 includes or is formed from a transparent conductive oxide (TCO), the first electrode 510 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 510 is formed from, for example, a network composed of metallic nanowires, for example composed of Ag, which can be combined with conductive polymers, a network composed of carbon nanotubes which can be combined with conductive polymers, or from graphene layers and composites, the first electrode 510 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 510 can be formed as an anode, that is to say as a hole-injecting electrode, or as a cathode, that is to say as an electron-injecting electrode.

The first electrode 510 can have a first electrical contact pad 108, 110, to which a first electrical potential (provided by an energy source (not illustrated), for example a current source or a voltage source) can be applied. Alternatively, the first electrical potential can be applied to the carrier 502 and then be applied indirectly to the first electrode 510 via said carrier. The first electrical potential can be, for example, the ground potential or some other predefined reference potential.

The organic functional layer structure 512 may include one or a plurality of emitter layers (not illustrated), for example including fluorescent and/or phosphorescent emitters, and one or a plurality of hole-conducting layers (also designated as hole transport layer(s)) (not illustrated). In various embodiments, one or a plurality of electron-conducting layers (also designated as electron transport layer(s)) can alternatively or additionally be provided.

Examples of emitter materials which can be used in the light emitting component 106 in accordance with various embodiments for the emitter layer(s) include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent $Ir(ppy)_3$ (tris(2-phenylpyridine)iridium III), red phosphorescent Ru $(dtb-bpy)_3*2(PF_6)$ (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited for example by means of thermal evaporation, an atomic layer deposition method and/or a molecular layer deposition method. Furthermore, it is possible to use polymer emitters, which can be deposited, in particular, by means of a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) of the light emitting component 106 can be selected for example such that the light emitting component 106 emits white light. The emitter layer(s) may include a plurality of emitter materials that emit in different colors (for example blue and yellow or blue, green and red); alternatively, the emitter layer(s) can also be constructed from a plurality of partial layers, such as a blue fluorescent emitter layer or blue phosphorescent emitter layer, a green phosphorescent emitter layer and a red phosphorescent emitter layer. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure 512 can generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic functional layer structure 512 may include one or a plurality of electroluminescent layers embodied as a hole transport layer, so as to enable for example in the case of an OLED an effective hole injection into an electroluminescent layer or an electroluminescent region. Alternatively, in various embodiments, the organic functional layer structure 512 may include one or a plurality of functional layers embodied as an electron transport layer, so as to enable for example in an OLED an effective electron injection into an electroluminescent layer or an electroluminescent region. By way of example, tertiary amines, carbazole derivatives, conductive polyaniline or polyethylene dioxythiophene can be used as substance for the hole transport layer. In various embodiments, the one or the plurality of electroluminescent layers can be embodied as an electroluminescent layer.

In various embodiments, the hole transport layer can be applied, for example deposited, on or above the first electrode 510, and the emitter layer can be applied, for example deposited, on or above the hole transport layer. In various embodiments, the electron transport layer can be applied, for example deposited, on or above the emitter layer.

In various embodiments, the organic functional layer structure 512 (that is to say for example the sum of the thicknesses of hole transport layer(s) and emitter layer(s) and electron transport layer(s)) can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 504 can have for example a stack of a plurality of organic light emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 512 can have for example a stack of two, three or four OLEDs arranged directly one above another, in which case for example the organic functional layer structure 512 can have a layer thickness of a maximum of approximately 3 µm.

The light emitting component 106 can optionally generally include organic functional layer structures, for example arranged on or above the one or the plurality of emitter layers or on or above the electron transport layer(s), which serve to further improve the functionality and thus the efficiency of the light emitting component 106. The further organic functional layer structures can be separated from one another for example by means of a charge generating layer (CGL) structure.

The second electrode 514 (for example in the form of a second electrode layer 514) can be applied on or above the organic functional layer structure 512 or, if appropriate, on or above the one or the plurality of further organic functional layer structures.

In various embodiments, the second electrode 514 may include or be formed from the same substances as the first electrode 510, metals being particularly suitable in various embodiments.

In various embodiments, the second electrode 514 (for example for the case of a metallic second electrode 514) can have for example a layer thickness of less than or equal to approximately 200 nm, for example a layer thickness of less than or equal to approximately 150 nm, for example a layer thickness of less than or equal to approximately 100 nm, for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 514 can generally be formed in a similar manner to the first electrode 510, or differently than the latter. In various embodiments, the second electrode 514 can be formed from one or more of the substances and with the respective layer thickness, as described above in connection with the first electrode 510. In various embodiments, both the first electrode 510 and the second electrode 514 are formed as translucent or transparent.

The second electrode 514 can be formed as an anode, that is to say as a hole-injecting electrode, or as a cathode, that is to say as an electron-injecting electrode.

The second electrode 514 can have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

A contact pad 108, 110 can be electrically and/or physically connected to an electrode 510, 514. However, a contact pad 108, 110 can also be designed as a region of an electrode 510, 514 or of a connection layer 504.

The contact pads 108, 110 may include or be formed from—as substance or substance mixture—a substance or a substance mixture similar to the first electrode 510 and/or the second electrode 514, for example as a metal layer structure including at least one chromium layer and at least one aluminum layer, for example chromium-aluminum-chromium (Cr—Al—Cr); or molybdenum-aluminum-molybdenum (Mo—Al—Mo), silver-magnesium (Ag—Mg), aluminum.

The contact pads 108, 110 may include or be formed as, for example, a contact area, a pin, a flexible printed circuit board, a terminal, a clip or some other electrical connection means.

In one embodiment, an electrical insulation 504 can be optional, for example when forming the organic electronic component 106 by means of a suitable mask process.

In one embodiment, the electrical connection layers 510, 522 and/or the contact pads 516, 518 can be formed as optically transparent, translucent or opaque.

The electrical connection layers 522 may include or be formed from—as substance or substance mixture—a substance or a substance mixture similar to the electrodes 510, 514.

The electrical insulations 504 can be designed in such a way that a current flow between two electrically conductive regions, for example between the first electrode 510 and the second electrode 514, is prevented. The substance or the substance mixture of the electrical insulation can be for example a coat or a coating medium, for example a polymer and/or a lacquer. The lacquer may include for example a coating substance that can be applied in liquid form or in pulverulent form, for example may include or be formed from a polyimide. The electrical insulations 504 can be applied or formed for example lithographically or by means of a printing method, for example in a structured manner. The printing method may include for example inkjet printing, screen printing and/or pad printing.

In accordance with one embodiment, the barrier thin-film layer 508 can be formed as an individual layer (to put it another way, as a single layer). In accordance with an alternative embodiment, the barrier thin-film layer 508 may include a plurality of partial layers formed one on top of another. In other words, in accordance with one embodiment, the barrier thin-film layer 508 can be formed as a layer stack. The barrier thin-film layer 508 or one or a plurality of partial layers of the barrier thin-film layer 508 can be formed for example by means of a suitable deposition method, e.g. by means of a molecular layer deposition (MLD) method, an atomic layer deposition (ALD) method in accordance with one embodiment, e.g. a plasma enhanced atomic layer deposition (PEALD) method or a plasmaless atomic layer deposition (PLALD) method, or by means of a chemical vapor deposition (CVD) method in accordance with another embodiment, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method and/or a molecular layer deposition (MLD) method, it is possible for very thin layers to be deposited. In particular, layers having layer thicknesses in the atomic layer range can be deposited.

In accordance with one embodiment, in the case of a barrier thin-film layer 508 having a plurality of partial layers, all the partial layers can be formed by means of an atomic layer deposition method and/or a molecular layer deposition (MLD) method. A layer sequence including only ALD layers and/or MLD layers can also be designated as a "nanolaminate".

In accordance with an alternative embodiment, in the case of a barrier thin-film layer 508 including a plurality of partial layers, one or a plurality of partial layers of the barrier thin-film layer 508 can be deposited by means of a different deposition method than an atomic layer deposition method, for example by means of a vapor deposition method.

In accordance with one embodiment, the barrier thin-film layer 508 can have a layer thickness of approximately 0.1 nm (one atomic layer) to approximately 1000 nm, for example a layer thickness of approximately 10 nm to approximately 100 nm in accordance with one embodiment, for example approximately 40 nm in accordance with one embodiment.

Furthermore, it should be pointed out that, in various embodiments, a barrier thin-film layer 508 can also be completely dispensed with. In such an embodiment, the optoelectronic component device may include a further encapsulation structure, for example, as a result of which a barrier thin-film layer 508 can become optional, for example a cover, for example a cavity glass encapsulation or metallic encapsulation.

In accordance with one embodiment in which the barrier thin-film layer 508 includes a plurality of partial layers, all the partial layers can have the same layer thickness. In accordance with another embodiment, the individual partial layers of the barrier thin-film layer 508 can have different layer thicknesses. In other words, at least one of the partial layers can have a different layer thickness than one or more other partial layers.

In accordance with one embodiment, the barrier thin-film layer 508 or the individual partial layers of the barrier thin-film layer 508 can be formed as a translucent or transparent layer. In other words, the barrier thin-film layer 508 (or the individual partial layers of the barrier thin-film layer 508) can consist of a translucent or transparent substance (or a substance mixture that is translucent or transparent).

In accordance with one embodiment, the barrier thin-film layer 508 or (in the case of a layer stack having a plurality of partial layers) one or a plurality of the partial layers of the barrier thin-film layer 508 may include or be formed from one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 508 or (in the case of a layer stack having a plurality of partial layers) one or a plurality of the partial layers of the barrier thin-film layer 508 may include one or a plurality of high refractive index materials, to put it another way one or a plurality of materials having a high refractive index, for example having a refractive index of at least 2.

An adhesive layer 524 or adhesion layer 524 is arranged on or above the electrically active region, for example on or above the barrier thin-film layer 508, in such a way that the adhesion layer 524 seals the electrically active region areally and hermetically with respect to harmful environmental influences, for example reduces the diffusion rate of water and/or oxygen toward the barrier thin-film layer 508.

A cover 526, for example a glass cover 526, a metal film cover 526, a sealed plastics film cover 526, is at least partly arranged on or above the adhesion layer 524. The cover 526 can be adhesively bonded, for example laminated, on or above the barrier thin-film layer 508 for example by means of the adhesion layer 124.

In one embodiment, the cover 526, for example composed of glass, can be applied for example by means of frit bonding (glass frit bonding/glass soldering/seal glass bonding) to the barrier thin-film layer 108 by means of a conventional glass solder in the geometrical edge regions of the organic electronic component 500.

In various embodiments, the adhesion layer can be formed as translucent and/or transparent and can have a layer thickness of greater than approximately 1 μm, for example a layer thickness of several μm. In various embodiments, the adhesion layer may include or be a lamination adhesive.

In various embodiments, light-scattering particles can also be embedded into the adhesion layer 524, which particles can lead to a further improvement in the color angle distortion and the coupling-out efficiency. In various embodiments, the light-scattering particles provided can be dielectric scattering particles, for example, such as metal oxides, for example, such as e.g. silicon oxide (SiO$_2$), zinc oxide (ZnO), zirconium oxide (ZrO$_2$), indium tin oxide (ITO) or indium zinc oxide (IZO), gallium oxide (Ga$_2$O$_x$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 514 and the adhesion layer 524, an electrically insulating layer (not shown) can also be applied, for example SiN, SiOx, SiNOx, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, the adhesion layer 524 can be designed in such a way that the adhesion layer 524 has a refractive index which is less than the refractive index of the cover 526. Such an adhesion layer 524 may include for example a low refractive index adhesive such as, for example, an acrylate which has a refractive index of approximately 1.3. In one embodiment, the adhesion layer 524 may include for example a high refractive index adhesive which includes for example high refractive index, non-scattering particles and has a mean refractive index corresponding approximately to the mean refractive index of the organic functional layer structure, for example in a range of approximately 1.7 to approximately 2.0 or greater. Furthermore, a plurality of different adhesives can be provided in the adhesion layer 524, which form an adhesive layer sequence, for example form a second adhesion layer 110.

A getter layer can be arranged on or above the electrically active region, for example at least partly on or above the optically active region 506 and/or at least partly on or above the optically inactive region, in such a way that the getter layer seals the electrically active region hermetically with respect to harmful environmental influences, for example reduces the diffusion rate of water and/or oxygen toward the barrier thin-film layer 508 and/or the electrically active region. The cover 526 is at least partly arranged on or above the getter layer.

In various embodiments, the getter layer can be at least partly surrounded by at least one adhesion layer 524, 110, for example in such a way that the getter layer has no surface toward air.

In various embodiments, the getter layer may include a matrix and a getter distributed therein.

In various embodiments, the getter layer can be formed as translucent, transparent or opaque and have a layer thickness of greater than approximately 1 µm, for example a layer thickness of several µm. In various embodiments, the matrix of the getter layer may include a lamination adhesive.

In various embodiments, light-scattering particles can also be embedded into the getter layer, which particles can lead to a further improvement in the color angle distortion and the coupling-out efficiency. In various embodiments, the light-scattering particles provided can be dielectric scattering particles, for example, such as metal oxides, for example, such as e.g. silicon oxide (SiO$_2$), zinc oxide (ZnO), zirconium oxide (ZrO$_2$), indium tin oxide (ITO) or indium zinc oxide (IZO), gallium oxide (Ga$_2$O$_x$), aluminum oxide, or titanium oxide. Other particles may also be suitable provided that they have a refractive index that is different than the effective refractive index of the matrix of the translucent layer structure of the getter layer, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 514 and the getter layer, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, the getter layer can be designed in such a way that the getter layer has a refractive index which is less than the refractive index of the cover 526. Such a getter layer can comprise for example a low refractive index adhesive such as, for example, an acrylate which has a refractive index of approximately 1.3. In one embodiment, the getter layer may include for example a high refractive index adhesive which includes for example high refractive index, non-scattering particles and has a mean refractive index corresponding approximately to the mean refractive index of the organic functional layer structure, for example in a range of approximately 1.7 to approximately 2.0 or greater. Furthermore, a plurality of different adhesives can be provided in the getter layer, which form an adhesive layer sequence, for example form a second adhesion layer 110.

In various embodiments, the optically active region 506 can be at least partly free of getter layer, for example if the getter layer is formed as opaque and the optically active region 506 is formed as transparent and/or translucent. Furthermore, the optically active region 506 can be at least partly free of getter layer in order to save getter layer.

In various embodiments, the cover 526 and/or the adhesive 124 can have a refractive index (for example at a wavelength of 633 nm) of 1.55.

Furthermore, in various embodiments, in addition, one or a plurality of coupling-in/coupling-out layers can also be formed in the organic optoelectronic component 500, for example an external coupling-out film on or above the carrier 502 (not illustrated) or an internal coupling-out layer (not illustrated) in the layer cross section of the organic optoelectronic component 106. The coupling-in/coupling-out layer may include a matrix and scattering centers distributed therein, wherein the mean refractive index of the coupling-in/coupling-out layer is greater than the mean refractive index of the layer from which the electromagnetic radiation is provided.

For the case where, for example, a light emitting monochromatic or emission spectrum-limited optoelectronic component is intended to be provided, it suffices for the optically translucent layer structure to be translucent at least in a partial range of the wavelength range of the desired monochromatic light or for the limited emission spectrum.

An optoelectronic component 106 which is formed as at least partly transmissive, for example transparent or translucent, for example a transmissive carrier 502, transmissive electrodes 510, 514, a transmissive organic functional layer structure 512, a transmissive barrier thin-film layer 508, a transmissive adhesive layer 524 and a transmissive cover 526, can have two planar optically active sides—the top side and the underside of the optoelectronic component 106 in the schematic cross-sectional view.

However, the optically active region 512 of an optoelectronic component 106 can also have only one optically active side and one optically inactive side, for example in the case of an optoelectronic component 106 designed as a top emitter or a bottom emitter, for example by virtue of the second electrode 500 or the barrier thin-film layer 508 being formed as reflective for electromagnetic radiation provided.

In various embodiments, a photodetector 116 can be formed (illustrated in FIGS. 5A, 5B) alongside the OLED 106. A photodetector 116 may include an optically active region 506 and can be formed for example as a photodiode 116 or a photoconductor 116.

In various embodiments, the photodetectors 116i can be covered with nontransparent layers, for example with an opaque layer, for example an insulator layer, metal layer, barrier thin-film layer and/or glass covers, in order to suppress direct ambient light. In various embodiments, the light from the OLED 106 is coupled into the optically active region 506 of the photodetector 116 via the carrier 502. In this case, the carrier 502 acts as a waveguide and should be formed as at least partly transmissive.

In various embodiments, the OLED 116 can be electrically insulated from the photodetector 116.

In various embodiments, a photodetector 116 can have an area in a range of approximately 0.5 mm$^2$ to approximately 250 mm$^2$, for example of greater than approximately 1 mm$^2$.

In various embodiments, the OLED 106 and the photodetector 116 can be optically connected to a waveguide, i.e. OLED 106 and photodetector 116 can provide an electromagnetic radiation into the waveguide and/or take up an electromagnetic radiation from the waveguide. In various embodiments, the waveguide can be formed as cover 526 and/or carrier 502. In various configurations, the OLED 106 and/or the photodetector 116 can be optically connected to the waveguide by means of an optical coupling structure, for example a barrier layer, barrier thin-film layer 508 or adhesive layer 524.

FIG. 5A shows an optoelectronic component including an OLED unit and a photodiode unit.

In one embodiment, a photodetector 116 can be formed as an organic photodiode 116, for example in a manner similar to the organic light emitting diode 106. An organic photodiode 116 may include for example at least one hole transport layer, electron transport layer, charge generating layer structure, hole injection layer, electron injection layer, in accordance with the description of the organic functional layer structure 512 of the OLED 106 (see above).

In one embodiment, a photodetector 116 may include: a third electrode 516 formed on or above the carrier 502. An organic functional layer structure 518 is formed on or above the third electrode 516. A fourth electrode 520 is formed above or on a second organic functional layer structure 518. The fourth electrode 520 is electrically insulated from the third electrode 516 by means of electrical insulations 504. The third electrode 516 can be physically and electrically connected to an electrical terminal 528. In various configurations, an electrical terminal 528 can also be designated as a contact pad 528. The fourth electrode 518 can be physically and electrically connected to an electrical connection layer 522. The electrical connection layer 522 can be formed on or above the carrier 502 in a geometrical edge region of the optically active region 506 of the photodetector 116, for example laterally alongside the third electrode 516. The electrical connection layer 522 can be electrically insulated from the third electrode 516 by means of a further electrical insulation 504. In various embodiments, the OLED 116 can be electrically insulated from the photodetector 116.

In one embodiment, the barrier thin-film layer 508 can be arranged on or above the fourth electrode 520 in such a way that the fourth electrode 520, the electrical insulations 504 and the organic functional layer structure 518 are surrounded by the barrier thin-film layer 508, that is to say are enclosed in a combination of the barrier thin-film layer 508 with the carrier 502. The barrier thin-film layer 508 can hermetically seal the enclosed layers with respect to harmful environmental influences.

In the embodiment, the second organic functional layer structure 518 can be protected against ambient light by virtue of the fourth electrode 520, the barrier thin-film layer 508, the adhesive layer 524 and/or the cover 526 having a low transmissivity, for example being formed as opaque or opal, and/or a mirror structure at least partly surrounding the second organic functional layer structure 518.

In the embodiment in which the organic photodiode 116 is formed in a manner similar to the organic light emitting diode 106, the electromagnetic radiation taken up by the organic photodiode 116 can generate an electrical voltage across the electrodes 516, 520. Said electrical voltage can be communicated as signal $D_i$ to the driver circuit as signal, for example in an amplified manner. An organic light emitting diode can be operated as an organic photodiode 116 by the hole-conducting electrode or the electron-conducting electrode being connected to the driver circuit.

FIG. 5B shows an optoelectronic component including an OLED unit and a photoconductor unit.

In one embodiment, a photodetector 116 can be formed as a photoconductor 116 alongside the organic light emitting diode 106.

In one embodiment, an optoelectric structure 116, for example a photoconductor 116, may include or be formed from a substance whose electrical resistance or electrical conductivity changes with the luminance of the incident electromagnetic radiation.

In one embodiment, the photoconductor 116 can be electrically insulated from the organic light emitting diode 106, for example by virtue of the photoconductor 116 including electrical connections 528, 522 which are electrically insulated from the organic light emitting diode 106, for example by means of electrical insulations 504.

In one embodiment, the photoconductor 116 can be formed as an organic light emitting diode and can be electrically insulated from the organic light emitting diode 106.

FIG. 6 shows a schematic illustration of a method for operating an optoelectronic component device, in accordance with various embodiments.

The illustration shows a schematic overview concerning a method for operating an optoelectronic component device in accordance with one embodiment of one of the descriptions of FIGS. 1, 2A-2C, 3A-3C, 4A-4D and 5A-5B.

In the rest state 602 of the optoelectronic component device, the OLED 106 is optically inactive, i.e. switched off. The photodetectors 116i in this state can measure a dark current "$D_i$ off", which can be taken into account as a background signal in the further course of the method.

In the switched-on state 604 of the optoelectronic component device, the OLEDs 106 are optically active, i.e. switched on, and provide electromagnetic radiation, for example emit light. The photodetectors 116i can measure the luminance "$D_i$ on" of the OLEDs 106 by means of the waveguide.

In various embodiments, after the measurement of the luminance in the switched-on state of the OLED 106, the luminance can be evaluated 606. For this purpose, the dark current and/or ambient light portions "$D_i$ off" can be eliminated from the measured luminances "$D_i$ on".

This can also be referred to as generating a signal after background signal correction $D'_i$. For the individual signals after background signal correction $D'_i$, it is then possible to determine a deviation $\Delta D_i$ from the mean signal strength $$\frac{1}{n}\sum_{i=1}^{n} D'_i$$

or standard deviation $$\frac{1}{n}\sum_{i=1}^{n} D'_i,$$

wherein "n" indicates the number of photodetectors 116$i$ in the optoelectronic component device and "i" is an integer denoting one of the photodetectors 116$i$.

$$\Delta D_i = \left|1 - \frac{D'_i}{\frac{1}{n}\sum_{i=1}^{n} D'_i}\right|$$

In one embodiment, if a signal of a photodetector after background signal correction $D'_i$ is less than a first threshold value $D'_{min}$, the OLED 106 can be forcibly switched off 610 by means of a feedback 608 to the driver circuit 104. Such a deviation can occur, for example, if a large region of the luminous area of the OLED 106 has become optically inactive, for example by means of a symmetrical short circuit or because the OLED 106 is degraded. A deviation can be necessary since the voltage drop across the OLED 106 can increase with aging (see FIGS. 10A and 10B).

In various embodiments, gradual aging of the OLED 106 with regard to the luminance provided (see FIGS. 10A and 10B) can be compensated for, for example by means of increasing the operating current.

In one embodiment, in the case of a deviation $\Delta D_i$ of a signal $D'_i$ from the mean signal $$\frac{1}{n}\sum_{i=1}^{n} D'_i$$

which is less than a second threshold value $D'_{max}$, the OLED 106 can be forcibly switched off 612 by means of a feedback 614 to the driver circuit 104. Such a deviation can be brought about for example by means of a particle-induced short circuit if one of the photodetectors 116$i$ is closer to the dark spot than other photodetectors. Such a deviation $\Delta D_i$ can have for example an absolute value in a range of approximately 20% to approximately 100% of the mean signal. In a further embodiment, in the case of such a deviation, the operating parameter set of the OLED 106 can be changed (see FIGS. 7A-7C).

In various embodiments, the signals $D_i$ of the photodetectors 116$i$ can be measured or determined individually successively, simultaneously or in groups.

In various embodiments, the described method 600 can be performed when switching on the OLED 106, during the operation of the OLED 106, for example periodically; manually or following predefined operating durations.

A differentiation between gradual aging and a particle-induced short circuit is possible since the luminance decreases substantially uniformly over the luminous area in the course of aging and a short-circuit-dictated decrease in the luminance causes the detector signals to change non-uniformly.

FIGS. 7A and 7B show a schematic illustration of a method for operating an optoelectronic component device, in accordance with various embodiments.

FIG. 7A illustrates an optoelectronic component device in accordance with one embodiment from the description of FIGS. 1, 2A-2C, 3A-3C, 4A-4D, 5A-5C and 6, which has a particle-induced short circuit 202 in the luminous area of the OLED 106. FIGS. 7B and 7C describe how an OLED 106 having a short circuit in the luminous area can be electrically repaired before a total failure.

After a particle in the luminous area of the OLED 106 has been ascertained (see description of FIG. 6), in various embodiments the OLED 106 can be momentarily overdriven by means of the driver circuit 104. By means of the driver circuit 104, for example, a program of voltage pulses and/or current pulses can be applied to the OLED 106 by means of the electrical connections 112, 114, for example with double to ten times the absolute value of the normal operating current. As a result, a short circuit can be removed, for example annealed, as a result of which the OLED 106 still remains functional and can continue to be operated normally. As a result of the momentary overdriving, a dark spot can be formed in the luminous area depending on the constitution of the particle that caused the short circuit. The signals $D_i$ after the removal of the particle-induced short circuit can constitute for the luminous area having a dark spot a new initial value or reference value with regard to aging of the OLED 106. In various embodiments, the new detector initial values (operation direction=0% with respect to luminance after removal of the last particle-induced short circuit) and the new operating parameters (voltage and current of the OLED 106) can be stored in a retrievable manner in the driver circuit 104. In various embodiments, for this purpose, the driver circuit may include a readable electronic memory or be connected to such a memory. In various embodiments, the driver circuit can be designed in such a way that the driver circuit can automatically set the operating parameters of the OLED.

FIG. 7B shows the luminance 704 of the OLED 106 as a function of time 712 measured by the photodetectors 116$a$, 116$b$, 116$c$, 116$d$.

FIG. 7C shows the operating voltage 714 and the operating current intensity 716 of the OLED 106 with respect to the luminance profile illustrated in FIG. 7B.

The illustration shows normal operation 718 of the OLED 106 with a slow degradation of the luminance (see FIGS. 10A and 10B). Upon an occurrence 720 of a particle-induced short circuit, a decrease in the voltage 714 and an increase in the current intensity 716 can occur. However, a decrease in the voltage in the case of a constant current intensity or an increase in the current intensity in the case of a circuit with constant voltage can also occur. Signal decreases of different magnitudes can be measured at the photodetectors 116$a$, 116$b$, 116$c$, 116$d$ (see FIG. 7B).

Upon the undershooting of a voltage threshold, overshooting of a current threshold and/or overshooting of a difference of the detector signals ($\Delta D'_i$) (see FIG. 7B), the driver circuit 104 can increase the operating current. As a result, a defect, for example a particle-induced short circuit 202, can be "annealed". During that, a boosting 722 of the measured luminance 704 of the photodetectors 116a, 116b, 116c, 116d and of the voltage 714 can occur. The boosting 722 can be limited in time, can be pulse-like or may include a sequence of a plurality of pulses in a pulse-like manner, voltage is stabilized. The driver circuit 104 should limit the maximum current 716 that flows through the OLED 106 in such a way that the OLED is not thermally destroyed during the boosting 722. The voltage drop 714 across the OLED 106 can then slightly rise or remain approximately constant—illustrated in 724. As a result, the particle-induced defect 202 can be "annealed". The luminance 704 of the detector signals 116a, 116b, 116c, 116d can remain approximately constant or else increase slightly during that. In various embodiments, the profile of the luminance during the "annealing" of particle-induced defects 202 or short circuits 202 can be used as "annealing condition" during the operation of the driver circuit 104.

After the "annealing" of particle-induced defects 202, the driver circuit can regulate the current intensity 716 down to the operating current before annealing, i.e. regulate it down to the original operating current—illustrated in 726. Afterward, the driver circuit 104 can continue to operate the OLED 106 in normal operation again. On account of the luminous area reduced by means of the annealing, a slightly altered voltage can be dropped across the OLED in the case of circuits with constant current. The photodetectors 116a, 116b, 116c, 116d can measure a different luminance 704 after annealing on account of the dark spot in the luminous area. In various embodiments, the driver circuit 104 can therefore carry out a new adjustment 606 for determining the luminance deviation $\Delta D'_i$, i.e. can newly determine the luminance distribution of the photodetectors 116a, 116b, 116c, 116d in the case of an operating duration of 0% (see FIGS. 10A and 10B).

In various embodiments, the driver circuit 104 can be designed for operating the OLED 106 with a constant operating current or a constant operating voltage.

In various embodiments, the driver circuit 104 can be designed for checking the OLED 106 with regard to a short circuit in the optically active area, for example by a current being momentarily applied to the OLED 106 in the reverse direction with respect to the forward direction of the OLED 106, for example after the photodetectors 116a, 116b, 116c, 116d have measured different luminances 704. A measurable current flow in the reverse direction in the case of different signals of the photodetectors 116a, 116b, 116c, 116d can allow a conclusion to be drawn about the presence of a short circuit.

In various embodiments, the driver circuit 104 can have different operating modes for repairing or healing particle-induced short circuits 202, for example "annealing" in the forward direction or reverse direction with respect to the forward direction of the OLED 106, for example with different progression profiles of the current intensity in the forward direction and reverse direction. Progression profiles of the current intensity can differ for example in the absolute value of a constant current, the current direction, the presence of pulses, the number, type and sequence of pulses (identical or different pulses), the pulse height, the pulse shape, the pulse duration and/or the pulse width, i.e. the spacing between two successive pulses.

In various embodiments, the driver circuit 104 can be designed additionally, instead or optionally for compensating for the aging of the OLED 106 (see FIGS. 10A and 10B).

In various embodiments, the driver circuit 104 can be designed in such a way that the signals of the photodetectors 116a, 116b, 116c, 116d after the repair of a short circuit are normalized again for the luminance deviation $\Delta D'_i$, for example by the signals of the photodetectors 116a, 116b, 116c, 116d after a repair being used as reference signals of an operating duration of 0%.

In various embodiments, the optoelectronic component device can be designed in such a way that the number, the positions and/or the distribution of the photodetectors 116a, 116b, 116c, 116d with respect to the short circuit 202 are taken into account in the repair of the short circuit 202, for example by virtue of the photodetectors 116a, 116b, 116c, 116d being read during repair in a pattern (see FIGS. 3A-3C) and/or being used for energizing the OLED 106 (see description of FIGS. 1, 2A-2C, 3A-3C, 4A-4D and 5A-5B). In other words: in various embodiments, the photodetectors 116a, 116b, 116c, 116d can be used as detector and/or for energizing the OLED 106 when there is a suspicion of an electrical short circuit.

Figure 8A:
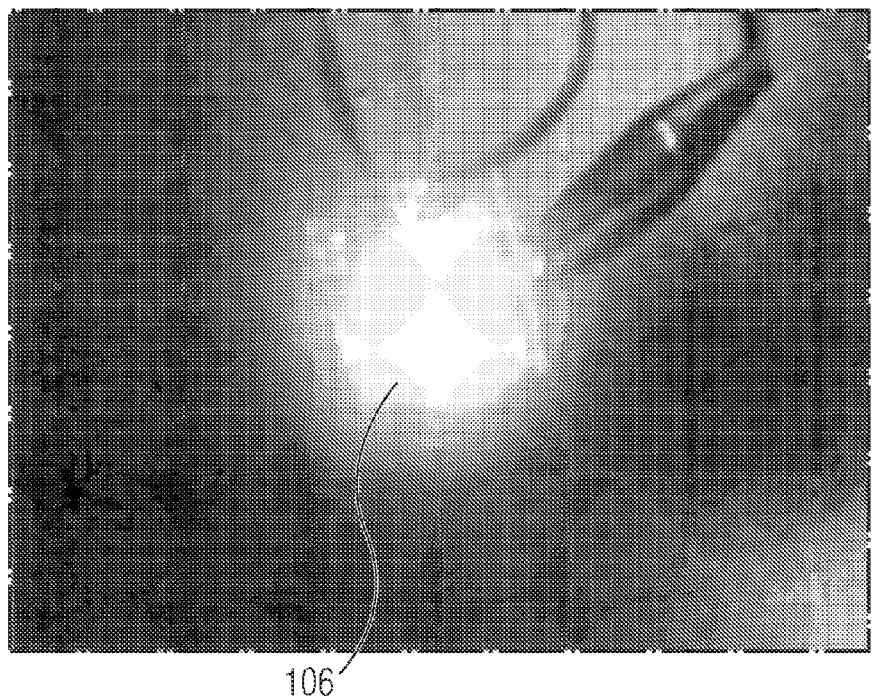
FIGS. 8A-8B show embodiments of an optoelectronic component device during and after overdriving.
Figure 8B:
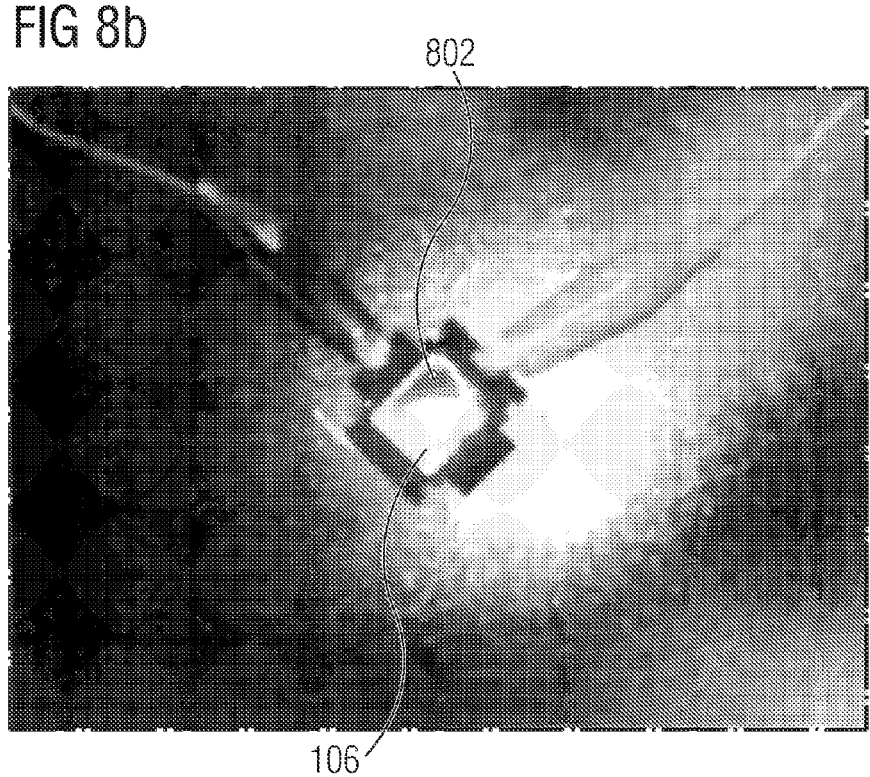

FIGS. 8A and 8B show embodiments of an optoelectronic component device during and after overdriving.

The illustrations show an embodiment of an optoelectronic component device in accordance with one of the descriptions of FIGS. 1, 2A-2C, 3A-3C, 4A-4D and 5A-5B in which an OLED 106 is driven manually with an overvoltage—illustrated in FIG. 8A during the overdriving.

The OLED 106 can continue to be operated with normal voltage after the overdriving—illustrated in FIG. 8B.

During the overdriving, the OLED can be momentarily operated with a current having an absolute value that is higher than the operating current of the OLED 106 in normal operation, for example in a range of approximately 100% to approximately 1000%. Some regions of the OLED 106 can degrade during overdriving, for example regions having particle-induced short circuits. After the overdriving, the degraded regions can be optically inactive in normal operation, i.e. with normal operating current, for example can be discernible as a dark spot 802 on the inherently optically active area. During the overdriving, the organic substances can become electrically insulating and/or react electrically. The non-degraded regions can be optically active and emit light in the same way as before the overdriving. As a result, the optoelectronic component can continue to be used.

In the case of automatic overdriving of the OLED 106 by means of an electronic system, for example a driver circuit 104, the electronic system would react significantly faster than is possible in the case of manual overdriving, and a dark spot 802 would thus turn out to be very much smaller than is illustrated in FIG. 8B.

Furthermore, current profiles and/or voltage profiles defined by means of a driver circuit 104 can be applied to the OLED 106 during the overdriving, for example voltage pulses having a defined width, amplitude and repetition rate.

FIGS. 9A-9C show various illustrations concerning the operation of an optoelectronic component device, in accordance with various embodiments.

FIG. 9A shows a schematic illustration of an optoelectronic component device with different combinations of emitter/detector components on a test chip having an edge length of 25 mm; the emitter/detector components can be operated as photodetectors 904a, 904b, 904c, 904d or as light emitting diodes 902a, 902b, 902c, 902d (diode). The emitter/detector components emit and/or absorb light from a common waveguide.

FIG. 9B shows a table concerning the optoelectronic properties of the optoelectronic component device in accordance with FIG. 9A.

In the illustration, the organic light emitting diodes 902*a*, 902*b*, 902*c*, 902*d* are operated with an operating voltage of approximately 8V in the optically active state. An optically active light emitting diode is identified by a "1" (light emitting diode is on and emits light) and an optically inactive light emitting diode is identified by a "0" (light emitting diode is off and emits no light). The illustration furthermore shows the detector voltages in volts (V) measured at the individual photodetectors 904*a*, 904*b*, 904*c*, 904*d* for the respective combination of optically active light emitting diodes 902*a*, 902*b*, 902*c*, 902*d*.

The illustration shows that the detector signal is dependent on the distance and also on the number of diodes and/or the size of the luminous area.

FIG. 9C shows a schematic illustration of an optoelectronic component device similar to FIG. 9A with a different combination of emitter/detector components.

FIG. 9D shows a table similar to FIG. 9B for the embodiment of the optoelectronic component device from FIG. 9C.

The illustration shows that the detector signal decreases with the distance of the diode 904*a*, 904*b*, 904*c* from the light emitting diode 902*a*.

FIGS. 10A and 10B show illustrations concerning the aging of a conventional OLED.

FIG. 10A illustrates a measured voltage drop 1002 and a measured, normalized luminance 1006 as a function of the normalized operating duration 1004 of a conventional OLED. The luminance 1006 is normalized to the luminance of an unused OLED, i.e. at 0% operating duration 1004. The operating duration 1004 is normalized to the time at which the luminance 1006 has fallen to 70% of the original luminance (at 0% operating duration).

FIG. 10B illustrates the luminous fields 1010, 1020, 1030 of a conventional OLED. The initially homogeneous luminous image—illustrated in 1010 in FIGS. 10A and 10B—of a conventional OLED becomes only slightly inhomogeneous during the gradual aging on account of the slight current and temperature inhomogeneities during operation.

During the production of an OLED, particles 1008 can be included in the layers of the OLED. On account of these particle inclusions 1008, a failure of the OLED can occur during operation, said failure being manifested as a short circuit (short). Almost the entire current can flow away via the included particles 1008—illustrated in 1020 in FIG. 10B.

As a result, the OLED can greatly heat up locally, as a result of which breaking (cracking), melting and/or degradation of the component can occur. As a result, an abrupt failure of the OLED can occur, as a result of which the operating voltage falls toward zero, illustrated in 1030 in FIGS. 10A and 10B. As is illustrated in 1020 in FIG. 10A, no unambiguous indication of the developing short circuit can be discerned in the voltage drop 1002 and the luminance 1006. In the luminous image, by contrast, a dark spot is clearly formed around the particles 1008, which dark spot can ultimately lead to the abrupt failure 1030 of the OLED.

In various embodiments, an optoelectronic component device, a method for producing an optoelectronic component device and a method for operating an optoelectronic component device are provided which make it possible to switch off an optoelectronic component before a particle-induced failure of the optoelectronic component and/or to locate the position of a particle-induced short circuit and to remove the latter. By means of the integration of photodetectors, for example organic photodetectors, on the carrier of an organic light emitting diode, the luminance or the luminous flux and/or the homogeneity thereof can be regularly monitored. As a result, the operating parameters of the organic light emitting diode, for example the operating voltage and/or the operating current, can be readjusted component-individually in accordance with the aging of the organic light emitting diode. By means of the signals of the photodetectors, it is furthermore possible to ascertain whether the luminance and/or the homogeneity of the light emitted by the organic light emitting diode deviate(s) from a set of stored standard values, threshold values or initial values, as a result of which the organic light emitting diode can, if appropriate, be switched off or healed. The set of standard values, threshold values or initial values can be stored for example in the driver circuit of the optoelectronic component device or a readable memory connected to the driver circuit. Furthermore, a failure of the organic light emitting diode can be ascertained by means of the photodetectors. Furthermore, by means of the photodetectors, a short circuit can be identified at an early stage and the organic light emitting diode can be switched off by means of a safety circuit, for example integrated in the driver circuit, before melting or breaking. As a result, the risk of fire for the optoelectronic component device can be reduced and safety during the operation of the optoelectronic component device can thus be increased. Furthermore, by means of the photodetectors, it is possible to ascertain particle-induced short circuits in the optically active area of the organic light emitting diode and/or to calculate the position of the particle-induced short circuit. The particle-induced short circuits can then be annealed by means of an overvoltage or by means of a laser. As a result, the operating duration of an organic light emitting diode can be increased, for example in safety-relevant components.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component device, comprising a first optically active structure designed for providing an electromagnetic radiation, wherein the first optically active structure is formed as or comprises one first organic optoelectronic component or a plurality of first organic optoelectronic components, wherein the first optoelectronic component is formed as a surface lighting component;
   a measuring structure designed for determining the luminance distribution of the electromagnetic radiation, wherein the measuring structure comprises a plurality of second optically active structures, wherein the second optically active structures are configured as optoelectric devices and/or opoelectronic devices which take up the electromagnetic radiation provided and provide a photocurrent, respectively;
   a waveguide designed for guiding the electromagnetic radiation provided;
   wherein the first optically active structure is optically coupled to the waveguide in such a way that the electromagnetic radiation provided is provided at least partly into the waveguide, and wherein the measuring structure is optically coupled to the waveguide in such a way that the electromagnetic radiation provided is taken up by the measuring structure at least partly from the waveguide;

wherein the measuring structure is designed to determine the luminance distribution in the first optically active structure by determining the photocurrents provided by the second optically active structures and determining a deviation of these photocurrents from a mean photocurrent.

2. The optoelectronic component device as claimed in claim 1, wherein the measuring structure is formed in such a way that in a first operating mode the measuring structure provides a further electromagnetic radiation from an electrical voltage or an electric current applied to the measuring structure, and that in a second operating mode the measuring structure generates generates an electric current or an electrical voltage from the electromagnetic radiation that is provided by the first optically active structure and is taken up by the second optically active structure.

3. The optoelectronic component device as claimed in claim 1, wherein at least one second optically active structure comprises or is formed as a photoconductor, a light emitting diode, an organic light emitting diode, a photodiode, an organic photodiode, a solar cell, and/or an organic solar cell.

4. The optoelectronic component device as claimed in claim 1, wherein the waveguide is formed as transparent or translucent.

5. The optoelectronic component device as claimed in claim 1, further comprising an optical coupling structure between the waveguide and the first optically active structure and/or between the waveguide and the measuring structure.

6. A method for producing an optoelectronic component device, the method comprising:

forming a first optically active structure for providing an electromagnetic radiation, wherein the first optically active structure is formed as or comprises one first organic optoelectronic component or a plurality of first organic optoelectronic components, wherein the first optoelectronic component is formed as a surface lighting component;

forming a measuring structure for determining the luminance distribution of the electromagnetic radiation, wherein the measuring structure comprises a plurality of second optically active structures, wherein the second optically active structures are configured as optoelectric devices and/or opoelectronic devices which take up the electromagnetic radiation provided and provide a photocurrent, respectively;

providing a waveguide designed for guiding the electromagnetic radiation provided;

wherein the first optically active structure is optically coupled to the waveguide in such a way that the electromagnetic radiation provided is provided at least partly into the waveguide, and wherein the measuring structure is optically coupled to the waveguide in such a way that the electromagnetic radiation provided is taken up by the measuring structure at least partly from the waveguide;

wherein the measuring structure is formed in such a way that the luminance distribution in the first optically active structure is determinable by determining the photocurrents provided by the second optically active structures and determining a deviation of these photocurrents from a mean photocurrent.

7. A method for operating an optoelectronic component device, the optoelectronic component device, comprising a first optically active structure designed for providing an electromagnetic radiation, wherein the first optically active structure is formed as or comprises one first organic optoelectronic component or a plurality of first organic optoelectronic components, wherein the first optoelectronic component is formed as a surface lighting component;

a measuring structure designed for determining the luminance distribution of the electromagnetic radiation, wherein the measuring structure comprises a plurality of second optically active structures, wherein the second optically active structures are configured as optoelectric devices and/or opoelectronic devices which take up the electromagnetic radiation provided and provide a photocurrent, respectively;

a waveguide designed for guiding the electromagnetic radiation provided;

wherein the first optically active structure is optically coupled to the waveguide in such a way that the electromagnetic radiation provided is provided at least partly into the waveguide, and wherein the measuring structure is optically coupled to the waveguide in such a way that the electromagnetic radiation provided is taken up by the measuring structure at least partly from the waveguide;

wherein the measuring structure is designed to determine the luminance distribution in the first optically active structure by determining the photocurrents provided by the second optically active structures and determining a deviation of these photocurrents from a mean photocurrent, the method comprising:

measuring the measurement parameters of the measuring structure while the first optically active structure is optically inactive;

measuring the measurement parameters of the measuring structure while the first optically active structure is optically active;

determining the respective differences between the measurement parameters of the plurality of second optically active structures of the measuring structure with the first optically active structure being optically active and the measurement parameters with the first optically active structure being optically inactive; and setting at least one operating parameter of the optically active structure on the basis of the measurement parameter differences among the plurality of second optically active structures.

8. The method as claimed in claim 7, wherein setting the at least one operating parameter comprises changing the at least one operating parameter from a first operating parameter set to a second operating parameter set if the plurality of second optoelectronic component have a difference in the signal differences that is greater than a first trigger absolute value.

9. The method as claimed in claim 8, wherein setting the at least one operating parameter comprises changing the at least one operating parameter from a first operating parameter set to a third operating parameter set if the plurality of second optoelectronic component have on average a signal difference that is less than a second trigger absolute value.

10. The method as claimed in claim 7,
wherein an operating parameter set comprises an operating current, an operating voltage and/or a luminance of the first optically active structure.

11. The method as claimed in claim 10,
wherein the second operating parameter set overdrives the first optically active structure in such a way that the operating current, the operating voltage and/or the luminance are/is increased.

* * * * *